United States Patent
Kurokawa

(10) Patent No.: US 10,922,605 B2
(45) Date of Patent: Feb. 16, 2021

(54) SEMICONDUCTOR DEVICE AND ELECTRONIC DEVICE

(71) Applicant: Semiconductor Energy Laboratory Co., Ltd., Atsugi (JP)

(72) Inventor: Yoshiyuki Kurokawa, Sagamihara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 1072 days.

(21) Appl. No.: 15/296,566

(22) Filed: Oct. 18, 2016

(65) Prior Publication Data

US 2017/0116512 A1    Apr. 27, 2017

(30) Foreign Application Priority Data

Oct. 23, 2015 (JP) .............................. JP2015-208505
Nov. 24, 2015 (JP) .............................. JP2015-228425

(51) Int. Cl.
| | |
|---|---|
| *G06N 3/06* | (2006.01) |
| *G06N 3/063* | (2006.01) |
| *G11C 11/24* | (2006.01) |
| *G11C 11/54* | (2006.01) |
| *G11C 27/00* | (2006.01) |

(52) U.S. Cl.
CPC .......... *G06N 3/063* (2013.01); *G06N 3/0635* (2013.01); *G11C 11/24* (2013.01); *G11C 11/54* (2013.01); *G11C 27/005* (2013.01)

(58) Field of Classification Search
CPC ...... G06N 3/063; G06N 3/0635; G11C 11/24; G11C 11/54; G11C 27/005
(Continued)

(56) References Cited

U.S. PATENT DOCUMENTS

| | | | |
|---|---|---|---|
| 5,047,655 | A | 9/1991 | Chambost et al. |
| 5,071,171 | A | 12/1991 | Perratone |
| (Continued) | | | |

FOREIGN PATENT DOCUMENTS

| | | |
|---|---|---|
| CN | 101794822 A | 8/2010 |
| CN | 101807600 A | 8/2010 |
| (Continued) | | |

OTHER PUBLICATIONS

Morie et al ("An All-Analog Expandable Neural Network LSI with On-Chip. Backpropagation Learning" (Year:1994).*

(Continued)

*Primary Examiner* — Lut Wong
(74) *Attorney, Agent, or Firm* — Robinson Intellectual Property Law Office; Eric J. Robinson

(57) ABSTRACT

A neuron circuit can switch between two functions: as an input neuron circuit, and as a hidden neuron circuit. An error circuit can switch between two functions: as a hidden error circuit, and as an output neuron circuit. A switching circuit is configured to be capable of changing the connections between the neuron circuit, a synapse circuit, and the error circuit. The synapse circuit includes an analog memory that stores data that corresponds to the connection strength between the input neuron circuit and the hidden neuron circuit or between the hidden neuron circuit and the output neuron circuit, a writing circuit that changes the data in the analog memory, and a weighting circuit that weights an input signal in reaction to the data of the analog memory and outputs the weighted output signal. The analog memory includes a transistor comprising an oxide semiconductor with extremely low off-state current.

8 Claims, 33 Drawing Sheets

(58) Field of Classification Search
USPC .......................................................... 706/33
See application file for complete search history.

(56) References Cited

U.S. PATENT DOCUMENTS

| | | | |
|---|---|---|---|
| 5,093,803 A | 3/1992 | Howard et al. | |
| 5,155,802 A | 10/1992 | Mueller et al. | |
| 5,268,320 A | 12/1993 | Holler et al. | |
| 5,604,820 A | 2/1997 | Ono | |
| 5,604,823 A | 2/1997 | Ono | |
| 5,619,593 A | 4/1997 | Ono | |
| 5,731,856 A | 3/1998 | Kim et al. | |
| 5,740,274 A | 4/1998 | Ono et al. | |
| 5,744,864 A | 4/1998 | Cillessen et al. | |
| 5,751,831 A | 5/1998 | Ono | |
| 5,753,954 A * | 5/1998 | Chi | H01L 27/115 257/318 |
| 5,878,165 A | 3/1999 | Ono | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,295,687 B2 | 11/2007 | Kee et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,216,878 B2 | 7/2012 | Sasaki et al. | |
| 8,278,162 B2 | 10/2012 | Akimoto et al. | |
| 8,278,657 B2 | 10/2012 | Sakata et al. | |
| 8,394,671 B2 | 3/2013 | Sasaki et al. | |
| 8,410,838 B2 | 4/2013 | Kato et al. | |
| 8,436,350 B2 | 5/2013 | Yamazaki et al. | |
| 8,450,144 B2 | 5/2013 | Sakata et al. | |
| 8,513,054 B2 | 8/2013 | Sasaki et al. | |
| 8,643,009 B2 | 2/2014 | Sakata et al. | |
| 8,697,488 B2 | 4/2014 | Sasaki et al. | |
| 8,785,996 B2 | 7/2014 | Colli et al. | |
| 8,841,661 B2 | 9/2014 | Akimoto et al. | |
| 8,860,485 B2 | 10/2014 | Kato et al. | |
| 9,293,566 B2 | 3/2016 | Sasaki et al. | |
| 9,299,807 B2 | 3/2016 | Sasaki et al. | |
| 9,349,722 B2 | 5/2016 | Kurokawa | |
| 9,350,334 B2 | 5/2016 | Kato et al. | |
| 9,412,768 B2 | 8/2016 | Sasaki et al. | |
| 9,449,996 B2 | 9/2016 | Yamazaki et al. | |
| 9,653,490 B2 | 5/2017 | Umezaki | |
| 9,941,309 B2 | 4/2018 | Yamazaki et al. | |
| 9,985,118 B2 | 5/2018 | Sasaki et al. | |
| 10,418,467 B2 | 9/2019 | Sasaki et al. | |
| 10,453,866 B2 | 10/2019 | Umezaki | |
| 10,505,520 B2 | 12/2019 | Kato et al. | |
| 10,790,383 B2 | 9/2020 | Sasaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0028705 A1 | 2/2003 | Arima | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0083193 A1 | 4/2004 | Shi et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0004579 A1 | 1/2011 | Snider | |
| 2012/0032730 A1* | 2/2012 | Koyama | H01L 29/7869 327/530 |
| 2012/0038409 A1 | 2/2012 | Colli et al. | |
| 2015/0178619 A1 | 6/2015 | Nishitani et al. | |
| 2016/0343452 A1 | 11/2016 | Ikeda et al. | |
| 2017/0063351 A1 | 3/2017 | Kurokawa | |
| 2017/0083469 A1 | 3/2017 | Catthoor et al. | |

FOREIGN PATENT DOCUMENTS

| | | |
|---|---|---|
| CN | 101814530 A | 8/2010 |
| CN | 101847661 A | 9/2010 |

(56) References Cited

FOREIGN PATENT DOCUMENTS

| CN | 102422426 A | 4/2012 |
|---|---|---|
| CN | 102473728 A | 5/2012 |
| CN | 102668077 A | 9/2012 |
| CN | 103324979 A | 9/2013 |
| CN | 203642941 U | 6/2014 |
| CN | 104508549 A | 4/2015 |
| CN | 104867464 A | 8/2015 |
| EP | 1737044 A | 12/2006 |
| EP | 2226847 A | 9/2010 |
| EP | 2887395 A | 6/2015 |
| EP | 3236504 A | 10/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-216160 A | 8/1992 |
| JP | 05-012466 A | 1/1993 |
| JP | 05-067062 A | 3/1993 |
| JP | 05-197707 A | 8/1993 |
| JP | 05-251705 A | 9/1993 |
| JP | 05-307605 A | 11/1993 |
| JP | 06-120522 A | 4/1994 |
| JP | 06-187472 A | 7/1994 |
| JP | 07-093277 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-259939 A | 9/2002 |
| JP | 2002-289859 A | 10/2002 |
| JP | 2003-086000 A | 3/2003 |
| JP | 2003-086808 A | 3/2003 |
| JP | 2004-078959 A | 3/2004 |
| JP | 2004-103957 A | 4/2004 |
| JP | 2004-273614 A | 9/2004 |
| JP | 2004-273732 A | 9/2004 |
| JP | 2006-178666 A | 7/2006 |
| JP | 2009-042898 A | 2/2009 |
| JP | 2009-296353 A | 12/2009 |
| JP | 2011-515747 | 5/2011 |
| JP | 2013-242954 A | 12/2013 |
| WO | WO-2004/114391 | 12/2004 |
| WO | WO-2009/113993 | 9/2009 |
| WO | WO-2010/125986 | 11/2010 |
| WO | WO-2011/001880 | 1/2011 |
| WO | WO-2011/062075 | 5/2011 |
| WO | WO-2014/021356 | 2/2014 |
| WO | WO-2015/001697 | 1/2015 |

OTHER PUBLICATIONS

Lee et al ("VLSI Neuroprocessors for Video Motion Detection") (Year: 1993).*

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT"SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid state Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995; vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In-Ga-Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

(56) References Cited

OTHER PUBLICATIONS

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

Arima.Y et al., "A 336-Neuron, 28K-Synapse, Self-Learning Neural Network Chip with Branch-Neuron-Unit Architecture", IEEE Journal of Solid-State Circuits, Nov. 1, 1991, vol. 26, No. 11, pp. 1637-1644.

Arima.Y et al., "A Refreshable Analog VLSI Neural Network Chip with 400 Neurons and 40K Synapses", IEEE Journal of Solid-State Circuits, Dec. 1, 1992, vol. 27, No. 12, pp. 1854-1861.

Zhou.J et al., "Energy-Efficient Artificial Synapses Based on Flexible IGZO Electric-Double-Layer Transistors", IEEE Electron Device Letters, Feb. 2015, vol. 36, No. 2, pp. 198-200.

Vermesan.O, "VLSI design for analog neural computation", 1995, p. 6pages.

Valle.M et al., "An experimental analog VLSI neural network with on-chip back-propagation learning", Analog Integrated Circuits and Signal Processing, 1996, vol. 9, No. 3, pp. 231-245, Kluwer Academic Publishers.

Korean Office Action (Application No. 2017-7009507) dated Dec. 18, 2018.

Morie.T et al., "Analog VLSI Implementation of Adaptive Algorithms by an Extended Hebbian Synapse Circuit", IEICE Trans. Electron. (IEICE Transactions on Electronics), Mar. 1, 1992, vol. E75-C, No. 3, pp. 303-311.

Katayama.E et al., "A Method for Peak Position Estimation of Cross Correlation Functions Using Neural Network", ITE Technical Report, Mar. 2, 2001, vol. 25, No, 22, pp. 21-24.

International Search Report (Application No. PCT/IB2016/056241) dated Dec. 13, 2016.

Written Opinion (Application No. PCT/IB2016/056241) dated Dec. 13, 2016.

Kawashima.S et al., "13.3-in. 8K x 4K 664-ppi OLED Display Using CAAC-OS FETs", SID Digest '14 : SID International Symposium Digest of Technical Papers, Jun. 3, 2014, pp. 627-630.

Morie.T et al., "An All-Analog Expandable Neural Network LSI with On-Chip Backpropagation Learning", IEEE Journal of Solid-State Circuits, Sep. 1, 1994, vol. 29, No. 9, pp. 1086-1093.

Chinese Office Action (Application No. 201710454203.1) dated Mar. 27, 2020.

Chinese Office Action (Application No. 201710454203.1) dated Nov. 4, 2020.

\* cited by examiner

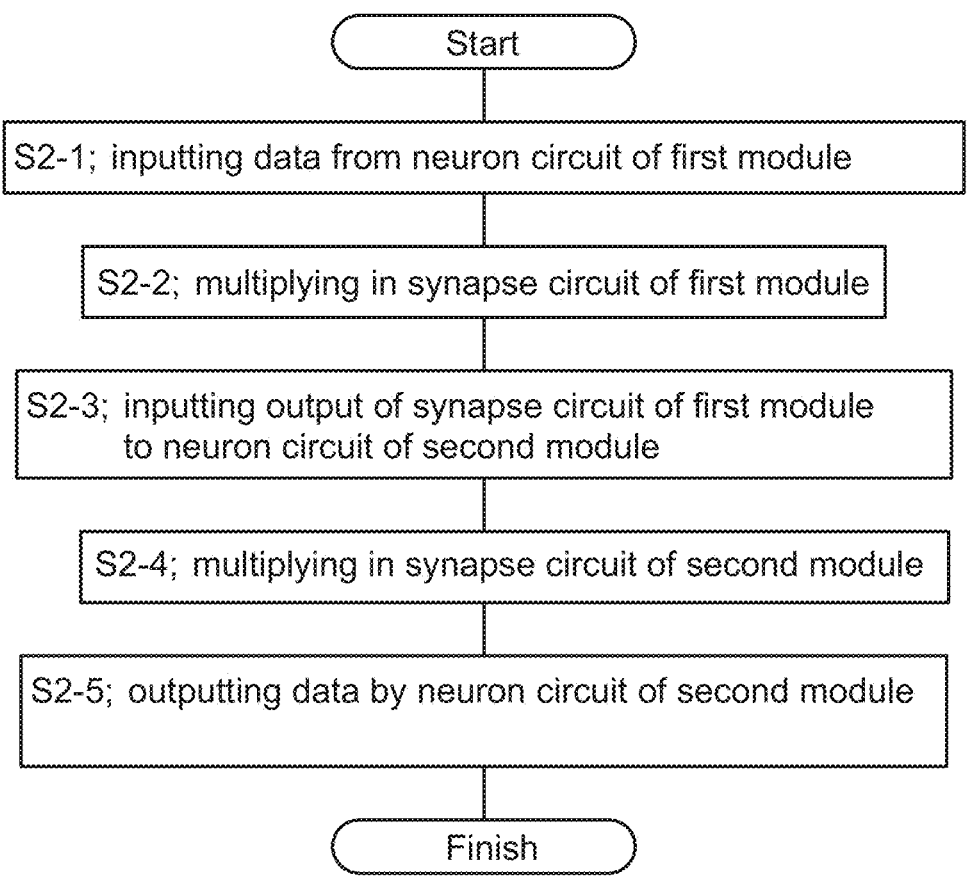

FIG. 19A
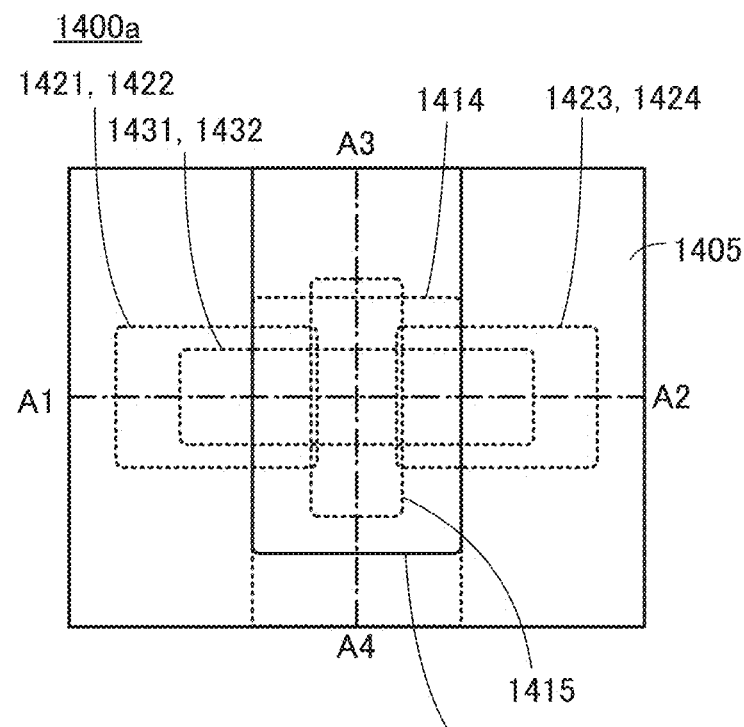
FIG. 19B
FIG. 19C
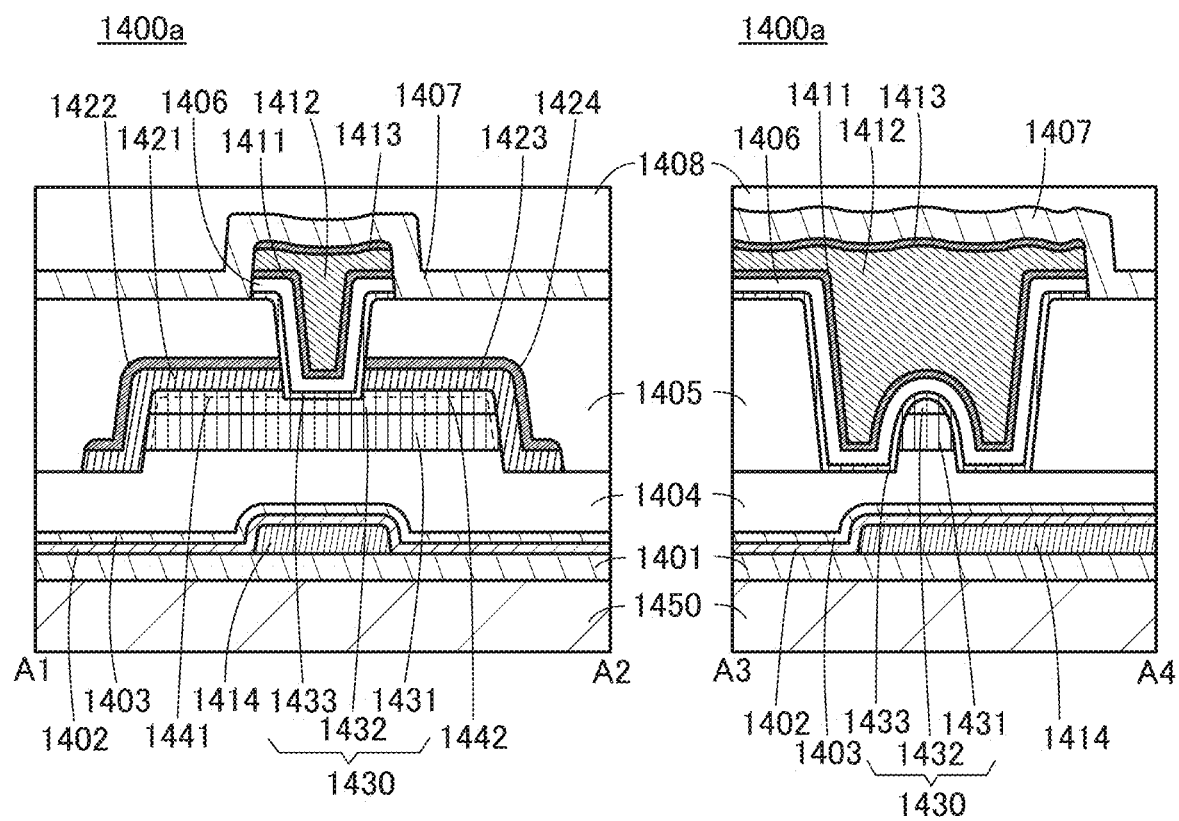

SEMICONDUCTOR DEVICE AND ELECTRONIC DEVICE

TECHNICAL FIELD

One embodiment of the present invention relates to an electronic device which includes a semiconductor device or the semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including the semiconductor element. Another example of the semiconductor device is a device provided with a circuit including a semiconductor element.

BACKGROUND ART

A neural network, which is a model simulating a network of neural circuits and implemented by computers or the like, is expected to enable a fabrication of computers with higher performance than von Neumann type computers. The research and development in this field is active, example of which can be seen in Non-Patent Document 1.

In the neural network, units which simulate neurons are connected to each other through units which simulate synapses. The neural network can change the connection strengths by learning, which enables high-speed pattern recognition and associative memory for various input patterns.

In an effective pattern recognition method, a unit simulating a neural network with a hierarchical perceptron architecture learns patterns of a target moving object as instructor data, then is given image data as an input data to determine the degree of matching between the instructor data and the input data, thereby extracting whether the moving object is included in the image or not. The neural network with the hierarchical perceptron architecture is configured with a neuron circuit, which is a unit simulating neurons, and a synapse circuit, which is a unit simulating a synapse.

The synapse circuit needs to have the functions of storing the connection strength between the neuron circuits, of multiplying the connection strength to an output of the neuron circuit, and of adding the results of each multiplication. The synapse circuit thus needs a memory to store the connection strength, a multiplier circuit for implementing a function of multiplication, and an adder circuit for implementing a function of addition.

As a screen of a television (TV) becomes larger, a demand for the option to watch high-definition images has been created. For this reason, ultra-high definition TV (UHDTV) broadcast has been increasingly put into practical use. Japan, which has promoted UHDTV broadcast, started 4K broadcast services utilizing a communication satellite (CS) and an optical line in 2015. The test broadcast of UHDTV (4K and 8K) by a broadcast satellite (BS) will start in the future. Therefore, various electronic devices which are compatible with 8K broadcast have been developed (see Non-Patent Document 2). In practical 8K broadcasts, 4K broadcasts and 2K broadcasts (full-high vision broadcast) will be also employed.

In addition, imaging elements are provided in a wide variety of electronic devices such as digital cameras or mobile phones. As described above, UHDTV broadcast has been increasingly put into practical use; in recent years, the number of pixels in imaging elements has been increased accordingly. As the number of pixels in imaging elements increases, the amount of data obtained by imaging inevitably increases. Thus, faster data reading and transfer are demanded. A compression of the image data is a known technique to react to the image data size increase caused by the increase in the number of pixels in the imaging element. Patent Document 1 discloses an imaging element module that compresses data by calculating differential data between a current imaging data and a past imaging data, during video recording or continuous shooting.

REFERENCE

Patent Document

[Patent Document 1] Japanese Published Patent Application No. 2009-296353

Non-Patent Document

[Non-Patent Document 1] Yutaka Arima et al., "A Self-Learning Neural Network Chip with 125 Neurons and 10K Self-Organization Synapses," *IEEE Journal of Solid-State Circuits,* Vol. 26, No. 4, April 1991, pp. 607-611

[Non-Patent Document 2] S. Kawashima et al., "13.3-In. 8K×4K 664-ppi OLED Display Using CAAC-OS FETs," *SID* 2014 *DIGEST,* pp. 627-630

DISCLOSURE OF INVENTION

However, in the case where the memory, the multiplier circuit, and the adder circuit are configured with digital circuits, the memory to store multiple bits and the adder and multiplier circuits capable of processing multiple bits are needed. This makes the circuit configuration large and reliant upon minute patterning.

Furthermore, in the case where the memory, the multiplier circuit, and the adder circuit are configured with analog circuits, the number of circuit elements can be reduced. However, configuring an analog memory that is ideal for the above memory, that is, an analog memory capable of storing analog values, is highly difficult. In the case where the analog memory cell with a dynamic random access memory (DRAM) type cell structure is used, the data retention time is extremely short. As measures against this issue, configurations such as where a large capacitor for memory storage is implemented in the analog memory, or where an analog data is recovered by periodic refresh operations, have been proposed. The configurations, however, increases in a chip area, and power consumption.

In addition, a configuration in which the hierarchical structure (e.g., the number of neural layers and the number of neurons in a given layer) can be freely changed according to the data input is preferred.

In light of the above, an object of one embodiment of the present invention is to provide a novel semiconductor device or the like that has a configuration which is different from that of existing semiconductor devices or the like.

Alternatively, an object of one embodiment of the present invention is to provide a semiconductor device or the like with a novel configuration and a reduced chip area. Another object of one embodiment of the present invention is to provide a semiconductor device or the like with a novel configuration, in which power consumption is reduced. Another object of one embodiment of the present invention is to provide a semiconductor device or the like with a novel configuration, in which the hierarchical structure constituting of circuits such as the neuron circuit or the synapse circuit can be freely changed.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device that includes a first circuit, a second circuit, and a third circuit. The first circuit includes a first function of amplifying a first signal and output the first signal to the second circuit, and a second function of converting the first signal from current to voltage and output the first signal converted from current to voltage to the third circuit. The second circuit includes a first multiplier circuit that changes data corresponding to a connection strength, an analog memory that stores the data, and a second multiplier circuit that outputs a second signal that is obtained by weighting of the first signal. The third circuit includes a first function of converting the second signal from current to voltage and output the second signal converted from current to voltage to the outside, and a second function of generating a fourth signal from a difference between the first signal converted from current into voltage and a third signal that is input from the outside. The analog memory includes a transistor that includes an oxide semiconductor in a channel formation region.

In one embodiment of the present invention, the first multiplier circuit of the semiconductor device preferably includes a function of changing the data in reaction to the first signal converted from current into voltage and the fourth signal.

One embodiment of the present invention is an electronic device including an encoder for encoding video data, which utilizes the above semiconductor device. The video data includes first video data and second video data. The semiconductor device compares the first video data and the second video data when the first video data and the second video data are input to the semiconductor device, and obtains a motion vector from the first video data to the second video data when the first video data and the second video data match.

Note that other embodiments of the present invention will be described in the following embodiments with reference to the drawings.

One embodiment of the present invention can provide a novel semiconductor device, a novel display device, a novel electronic device, or the like.

One embodiment of the present invention can provide a semiconductor device or the like with a novel configuration and a reduced chip area. Another embodiment of the present invention can provide a semiconductor device or the like with a novel configuration, in which power consumption is reduced. Another embodiment of the present invention can provide a semiconductor device or the like with a novel configuration, in which the hierarchical structure constituting of circuits such as the neuron circuit or the synapse circuit can be freely changed.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIG. 11 illustrates an example of a flow chart;

FIG. 19A illustrates an example of a top view, and FIGS. 19B and 19C each illustrate an example of a cross-sectional diagram;

BEST MODE FOR CARRYING OUT THE INVENTION

Figure 1:
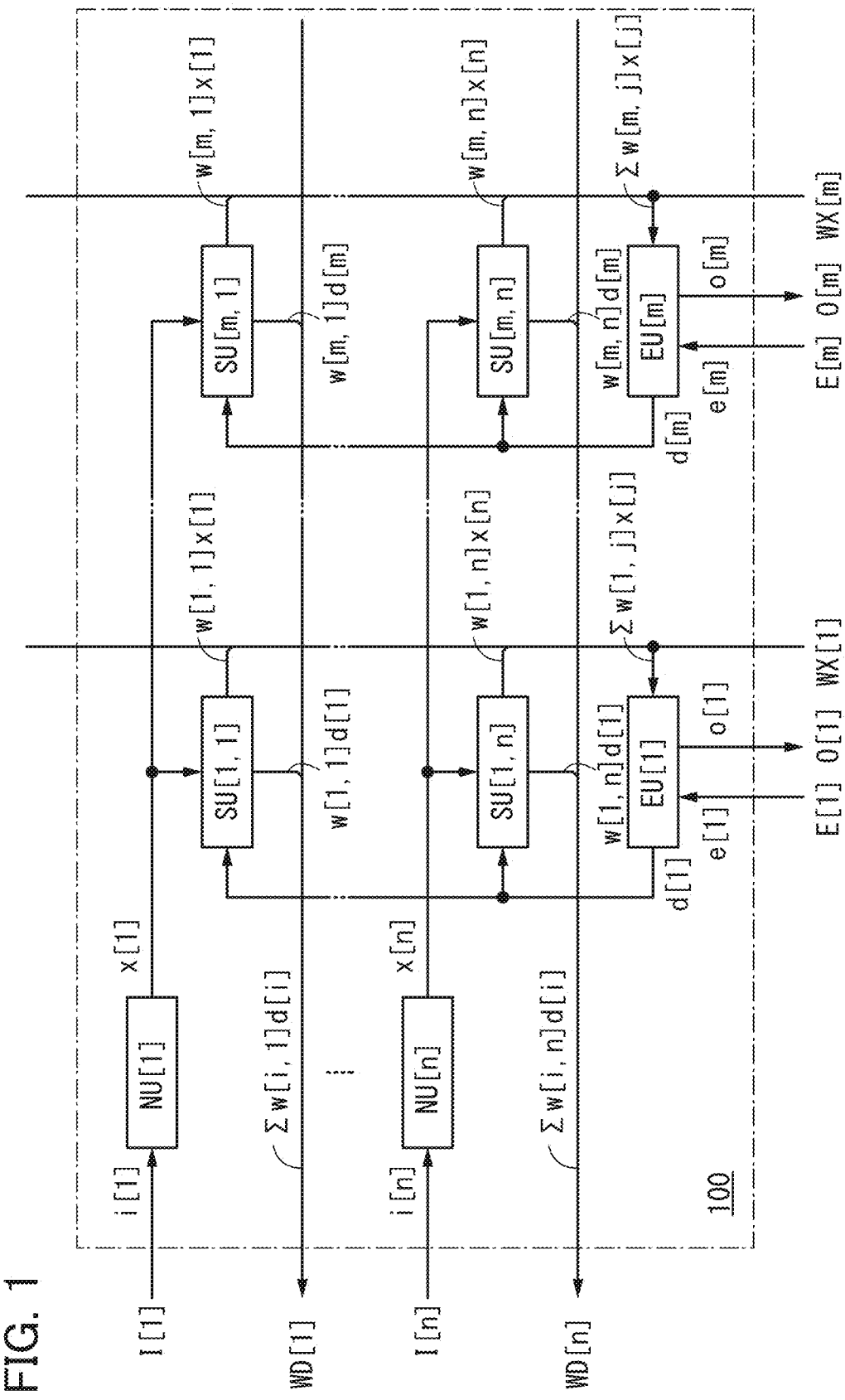
FIG. 1 illustrates an example of a block diagram.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be omitted in other embodiments or claims.

The same elements or elements having similar functions, elements formed using the same material, elements formed at the same time, or the like in the drawings are denoted by the same reference numerals in some cases, and the description thereof is not repeated in some cases.

Embodiment 1

The embodiment of the present invention is explained with reference to FIG. 1, FIGS. 2A to 2D, FIG. 3, FIG. 4, FIG. 5, FIG. 6, FIG. 7, FIG. 8, and FIG. 9.
<Module Configuration>

FIG. 1 shows circuit blocks of module 100 that make up the semiconductor device. Module 100 is made up of n (n is a natural number) neuron circuits NU, m×n (m is a natural number) synapse circuits SU, and m error circuits EU.

Each of the circuit blocks that make up the module 100 illustrated in FIG. 1 is explained below.

Figure 2A:
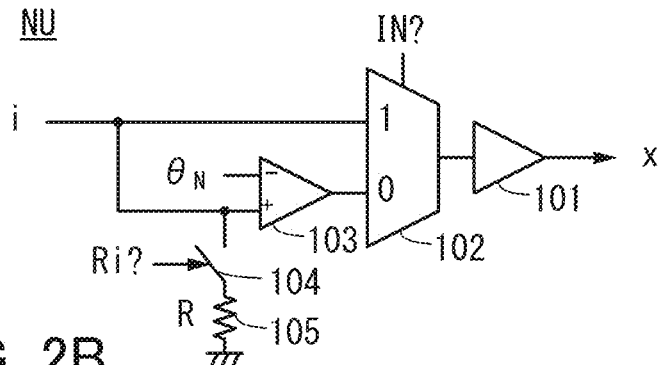
FIGS. 2A, 2B, 2C, and 2D each illustrate an example of a circuit diagram.

FIG. 2A illustrates a configuration of the neuron circuit NU. The neuron circuit NU can function as an input neuron circuit or as a hidden neuron circuit. The neuron circuit NU includes an amplifier 101, a selector circuit 102, a differential amplifier 103, a switch 104 and a resistor 105.

When the neuron circuit NU is to function as the input neuron circuit, the signal to be output is changed to the side of "1" by a switching signal (IN? in FIGS. 2A to 2D) of the selector circuit 102. The neuron circuit NU that functions as the input neuron circuit is a circuit which receives an input signal i from the outside of the semiconductor device, and generates an output signal x to the synapse circuit SU within the same module through the selector circuit 102 and the amplifier 101.

The selector circuit 102 preferably inputs and outputs analog signals. The selector circuit 102 can be configured with a pass transistor and an analog switch, for example.

Figure 2B:
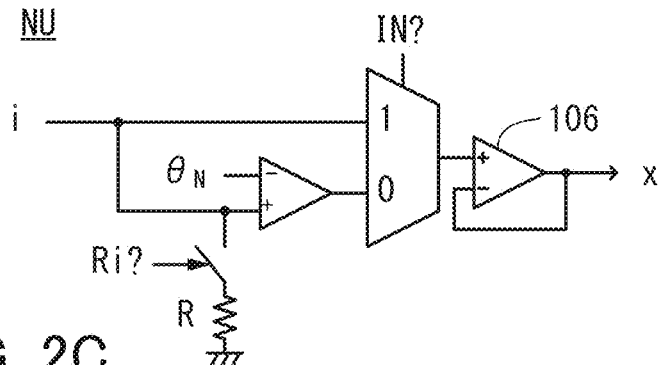
Figure 2C:
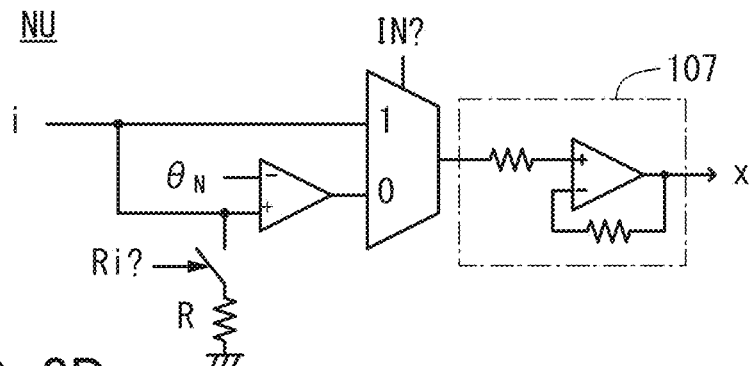
Figure 2D:
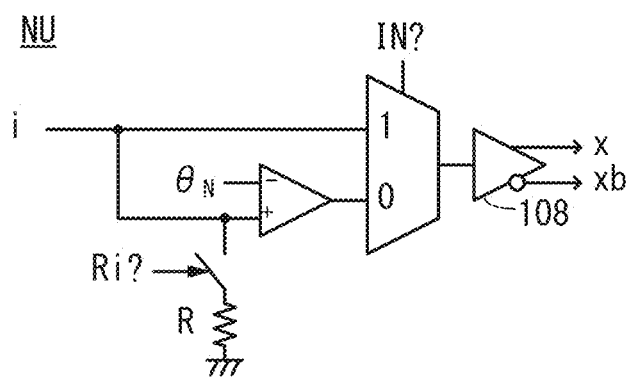

A unity gain buffer 106, which is illustrated in FIG. 2B, may be used as the amplifier 101, which is illustrated in FIG. 2A. The amplifier 101 may have a function of changing the standard signal level of the output signal x using an amplifier circuit 107, as illustrated in FIG. 2C. In addition, as illustrated in FIG. 2D, the amplifier 101 may have a function of generating a pair of differential signals (x and xb) as output signals by using a buffer 108, which generates differential signals. Furthermore, when the input signal i has an adequate driving power, the amplifier 101 is not necessarily implemented.

On the other hand, when the neuron circuit NU is to function as the hidden neuron circuit, the signal to be output is changed to the side of "0" by a switching signal (IN? in FIGS. 2A to 2D) of the selector circuit 102. The neuron circuit NU that functions as the hidden neuron circuit receives the input signal i that is output from the synapse circuit SU of the module in the previous stage, from which the neuron circuit NU generates the output signal x output to the synapse circuit SU in a different module, through the differential amplifier 103, the selector circuit 102, and the amplifier 101.

When the input signal i is the output signal of the synapse circuit SU, the input signal i corresponds to the sum (expressed as $\Sigma w[i,j]x[j]$) of the current of each of the synapse circuits SU. The sum of the current is converted into voltage with the resistor 105, and the differential voltage between this voltage and a threshold voltage $\theta_N$ is generated with the differential amplifier 103.

The signal (Ri? in FIGS. 2A to 2D) that controls the on/off state of the switch 104 may be set so that the signal Ri? turns on the switch 104 when the neuron circuit NU is to function as a hidden neuron circuit, and that the switch 104 is turned off in other periods.

The differential amplifier 103 is configured so that its output signal is equal to $f_H(X)$ in Formula (1) or can be approximated to $f_H(X)$ in Formula (1), when the input signal X is given as a variable.

[Formula (1)]

$$f_H(X) = \frac{1}{(1+e^{-\alpha_H(X-\theta_N)})} \quad (1)$$

$\alpha_H$ in Formula (1) is a given constant, and corresponds to the rate of change of the output signal, when $X=\theta_N$ is given. When the sum of the current of each of the synapse circuits, which is $\Sigma w[i,j]x[j]$, becomes higher than the threshold voltage $\theta_N$, the output signal $f_H(X)=1$; that is, the output signal reaches H level (expressed as "H" or "high level"). This is described as the "firing" of the neuron circuit NU. In other words, the threshold voltage $\theta_N$ corresponds to a threshold at which the neuron circuit NU fires.

Furthermore, when not all of the n neuron circuits NU are needed in the module, the potential of the input signal i of the unnecessary neuron circuit NU can be set at "0." In this case, the potential of the output signal x of the neuron circuit NU becomes "0," and the succeeding synapse circuit SU effectively does not function.

Figure 3:
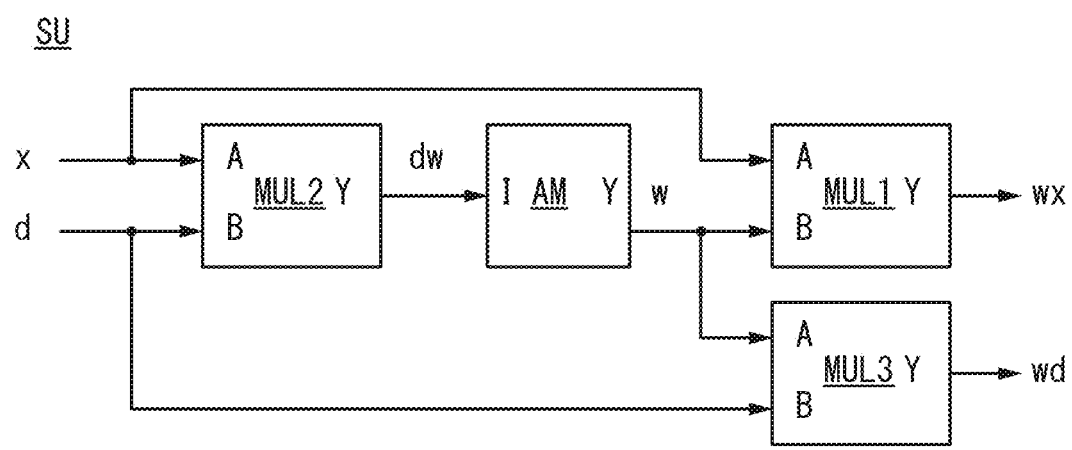
FIG. 3 illustrates an example of a block diagram.

FIG. 3 illustrates a configuration of the synapse circuit SU. The synapse circuit SU is made up of an analog memory AM, and multiplier circuits MUL1 to MUL3.

The analog memory AM has a function of storing data that corresponds to a connection strength (weight coefficient) w between the neuron circuit NU in the same module and the neuron circuit NU in the module in the succeeding stage. The analog memory AM also has a function of outputting a voltage that corresponds to the stored data.

The multiplier circuit MUL1 multiplies the output signal x from the neuron circuit NU of the same module by the weight coefficient w of the analog memory AM, thereby generating an output signal wx. A current that corresponds to the multiplication result is supplied as the output signal wx. That is, the multiplier circuit MUL1 outputs an output signal wx, which is obtained by weighting the output signal x from the neuron circuit NU in the same module according to the data in the analog memory AM, to the neuron circuit NU in the module of the succeeding stage, and to the error circuit EU in the same module.

The multiplier circuit MUL2 multiplies the output signal x from the neuron circuit NU of the same module by an output signal d from the error circuit EU in the same module, thereby generating an output signal dw. A current that corresponds to the multiplication result is supplied as the output signal dw. The output signal dw is supplied as a current that corresponds to the amount of the change of the weight coefficient w, which is stored in the analog memory AM. In other words, the multiplier circuit MUL2 updates the data in the analog memory AM according to the error signal d, which is output from the error circuit EU in the same module.

The multiplier circuit MUL3 multiplies the output signal d from the error circuit EU of the same module by the weight coefficient w of the analog memory AM, thereby generating an output signal wd. A current that corresponds to the multiplication result is supplied as the output signal wd. That is, the multiplier circuit MUL3 outputs an error signal wd, which is obtained by weighting the error signal d from the error circuit EU of the same module according to the data in the analog memory AM, to the error circuit EU in the module of the previous stage.

Figure 4:
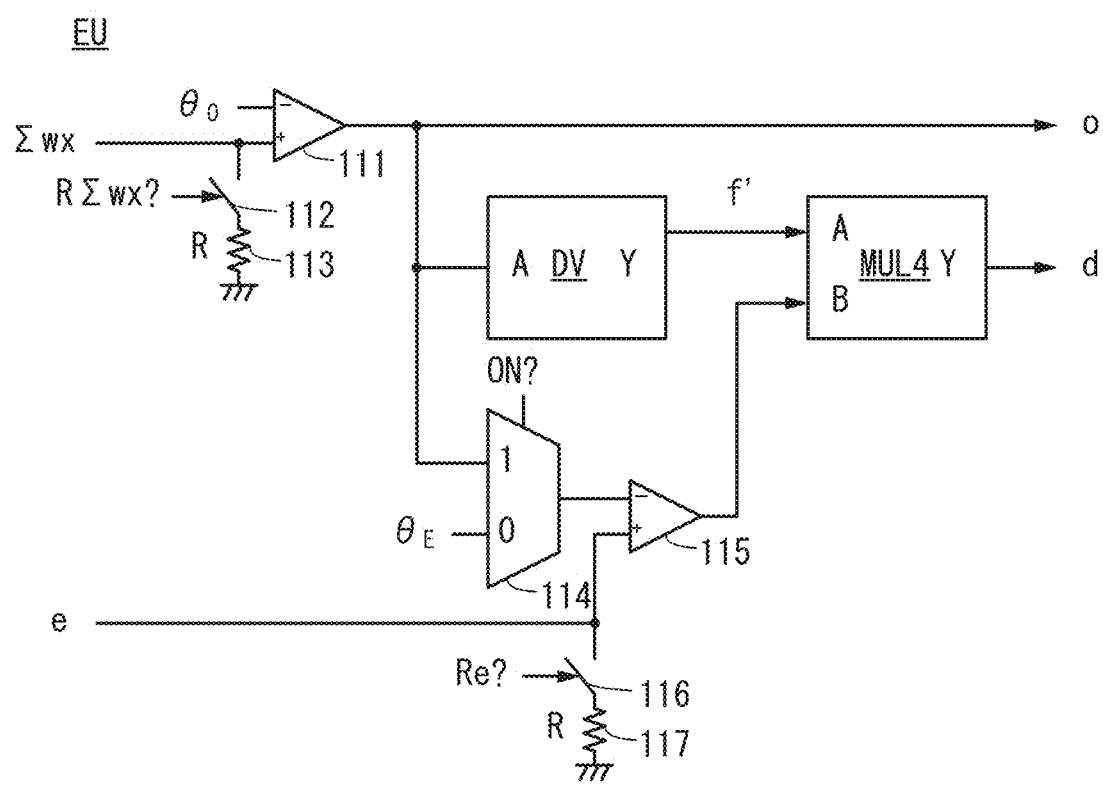
FIG. 4 illustrate an example of a block diagram.

FIG. 4 illustrates a configuration of the error circuit EU. The error circuit EU can function as the output neuron circuit or as a hidden error circuit. The error circuit EU includes a differential amplifier 111, a switch 112, a resistor 113, a differentiator circuit DV, a multiplier circuit MUL4, a selector circuit 114, a differential amplifier 115, a switch 116 and a resistor 117.

When the error circuit EU is to function as the output neuron circuit, the signal to be output is changed to the side of "1" by a switching signal (ON? in FIG. 4) of the selector circuit 114. The error circuit EU that functions as the output neuron circuit generates the signal o, which is output to the outside of the semiconductor device, from a signal Σwx, which correspond to a sum of current from the output signals wx that are output from the synapse circuits SU in the same stage with the differential amplifier 111. When the error circuit EU functions as an output neuron circuit, the difference signal (e−o) between the instructor signal e that is supplied from the outside of the semiconductor device and the signal o is generated with a differential amplifier 115. In addition, when the error circuit EU functions as the output neuron circuit, the differentiator circuit DV generates a derivative f' of the signal o. Furthermore, the multiplier circuit MUL4 generates an error signal d by multiplying the difference signal (e−o) by the derivative f'. The error signal d is output to the synapse circuit SU of the same module. Note that when the instructor signal e is given as a voltage, a signal that controls the on/off state of the switch 116 (Re? in FIG. 4) is set to turn off the switch 116.

In addition, the differential amplifier 111 converts the output signal Σwx, which corresponds to the sum of current output from the synapse circuits SU in the same stage, to voltage with the resistor 113, then generates a difference voltage between the voltage output by the differential amplifier 111 and the threshold voltage $\theta_o$.

The differential amplifier 111 is configured so that the signal o is equal to $f_o(X)$ in Formula (2) or can be approximated to $f_o(X)$ in Formula (2), when the input signal X is given as a variable.

[Formula (2)]

$$f_O(X) = \frac{1}{(1 + e^{-\alpha_O(X-\theta_O)})} \quad (2)$$

In Formula (2), $\alpha_o$ is a given constant, and corresponds to the rate of change when $X=\theta_o$ is valid. When the potential of output signal Σwx becomes greater than the threshold voltage $\theta_o$, the equation $f_o(X)=1$ is valid; that is, the potential of the output signal becomes H level. This is described as the "firing" of the output neuron circuit EU. In other words, the threshold voltage $\theta_o$ corresponds to a threshold at which the neuron circuit EU fires.

On the other hand, when the error circuit EU is to function as the hidden error circuit, the signal to be output is changed to the side of "0" by the switching signal (ON? in FIG. 4) of the selector circuit 114. The error circuit EU that functions as the hidden error circuit generates the signal o in a similar manner as when the error circuit EU functions as an output neuron circuit; specifically, the error circuit EU generates the signal o from the signal Σwx, which corresponds to the sum of current from the output signals wx that are output from the synapse circuits SU in the same stage, with the differential amplifier 111. Furthermore, when the error circuit EU functions as a hidden error circuit, the sum of current from the error signals wd that are output from the synapse circuits SU of the modules in the succeeding stages is supplied as the instructor signal e; the error circuit EU then generates a difference signal with the differential amplifier 115.

The instructor signal e in this case is a signal Σw[i, j]d[i], which corresponds to the sum of current w[i, j]d[i]. This signal is converted to voltage with the resistor 117, and the difference signal is generated as the difference voltage between the instructor signal e converted into voltage and the reference voltage $\theta_E$. In addition, the differentiator circuit DV generates the derivative f' of the signal o. Furthermore, the multiplier circuit MUL4 generates the error signal d by multiplying the difference signal by the derivative f'. The error signal d is output to the synapse circuit SU of the same module.

When one stage is configured with a plurality of modules, the signal Σwx from the synapse circuits SU in the previous stage serves as an input signal of the neuron circuits NU that function as a plurality of hidden neuron circuits in a plurality of modules, and as an input signal of the error circuits EU that function as a plurality of error circuits in the plurality of modules in the previous stage. In this case, any one of the plurality of hidden neuron circuits may convert the input signal i to a voltage with the resistor 105, or any one of the plurality of error circuits may convert the input signal Σwx to a voltage with the resistor 113. A signal (RΣwx? in FIG. 4) that controls the on/off state of the switch 112 may be set so that the signal RΣwx? turns on the switch 112 when the error circuit EU is to function as a hidden error circuit, and that the switch 112 is turned off in other periods.

When one stage is configured with a plurality of modules, the error signal wd from the synapse circuits SU in the module of the succeeding stage serves as the instructor signal e of the error circuits EU that function as a plurality of hidden error circuits in the plurality of modules. In this case, the instructor signal e may be converted into voltage with a resistor 117 in any one of the plurality of error circuits EU. In other words, the signal (Re? in FIG. 4) that controls the on/off state of the switch 116 may be set so that the signal Re? turns on the switch 116 when the error circuit EU is to function as a hidden error circuit, and that the switch 116 is turned off in other periods.

<Configuration of Each Constituting Circuit of the Module>

Figure 5:
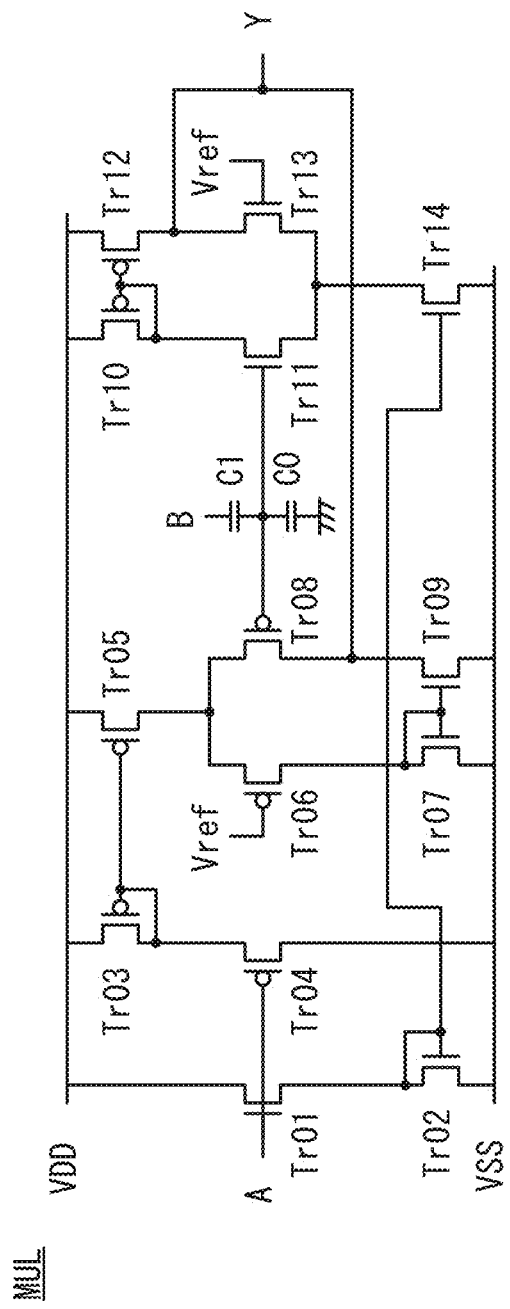
FIG. 5 illustrates an example of a circuit diagram.

FIG. 5 illustrates a configuration of the multiplier circuit MUL applicable to the multiplier circuits MUL1 to MUL4 in the synapse circuit SU and the error circuit EU. The multiplier circuit MUL is made up of a first transistor Tr01 to a fourteenth transistor Tr14, and capacitors C0 and C1. This multiplier circuit adopts a configuration which is based on a Chible multiplier circuit; a current that is proportional to the product of the input signals A and B is obtained as the output signal Y. In addition, when it is assumed that the capacitance of the capacitors C0 and C1 are adequately larger than gate capacitances of the eighth transistor Tr08 and the eleventh transistor Tr11, the potential change of the input signal B is multiplied by C1/(C0+C1), then is input to the gates of the eighth transistor Tr08 and the eleventh transistor Tr11. Thus, the input range of the input signal B can be made wide, which secures the linearity of the multiplier circuit MUL in a wide input range. Similarly, providing a capacitor to the input signal A secures the linearity of the multiplier circuit MUL in a wide input range.

Figure 6:
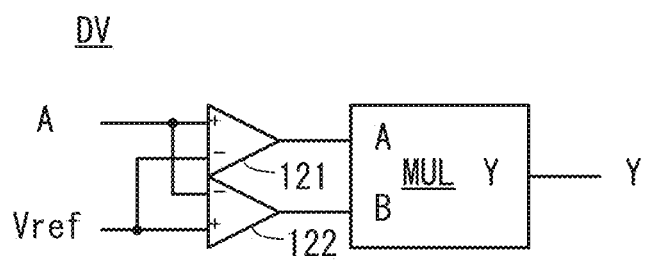
FIG. 6 illustrates an example of a circuit diagram.

FIG. 6 illustrates a configuration of the differentiator circuit DV in the error circuit EU. The differentiator circuit DV is made up of operational amplifiers 121 and 122, and the multiplier circuit MUL. Here, the operational amplifier 121 is configured so that when the difference between the non-inverted input signal A and the inverted input signal $V_{ref}$ is given as $X=A-V_{ref}$, its output signal $Y_1$ follows or approximates the following equation: $Y_1=f(X)=1/(1+e^{-\alpha X})$. In addition, the operational amplifier 122 is configured so that when the difference between the non-inverted input signal $V_{ref}$ and the inverted input signal A is given as $X_2=V_{ref}-A=-X$, its output signal $Y_2$ follows or approximates the following equation: $Y_2=f(X_2)=1/(1+e^{-\alpha X_2})$. Here, $Y_2$ can be expressed as $Y_2=f(-X)=1/(1+e^{+\alpha x})=e^{-\alpha X}/(e^{-\alpha X}+1)=1-1/(1+e^{\alpha X}).=1-f(X)$. Therefore, the output of the multiplier circuit MUL can be expressed as $Y=Y_1 \times Y_2=f(X)[1-f(X)]=df(X)/dX$). That is, the differentiator circuit DV has a function of differentiating f(X).

Figure 7:
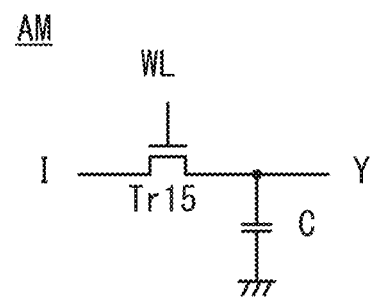
FIG. 7 illustrates an example of a circuit diagram.

FIG. 7 illustrates the configuration of the analog memory AM in the synapse circuit SU. The analog memory AM is made up of a transistor Tr15 and a capacitor C. Implementing a transistor with an extremely low off-state current using an oxide semiconductor as the transistor Tr15 enables the fabrication of an ideal analog memory. Thus, implementation of large capacitors for memory retention or the recovery of analog data through periodic refresh operations are unnecessary. This enables the shrinking of chip area and the reduction of power consumption. Because the analog memory AM is configured so that a current corresponding to the amount of change is supplied during the update of data, the amount of data change can be changed by adjusting the period in which the potential of the signal line WL is set at "H".

<Three-Layer Neural Network>

Figure 33:
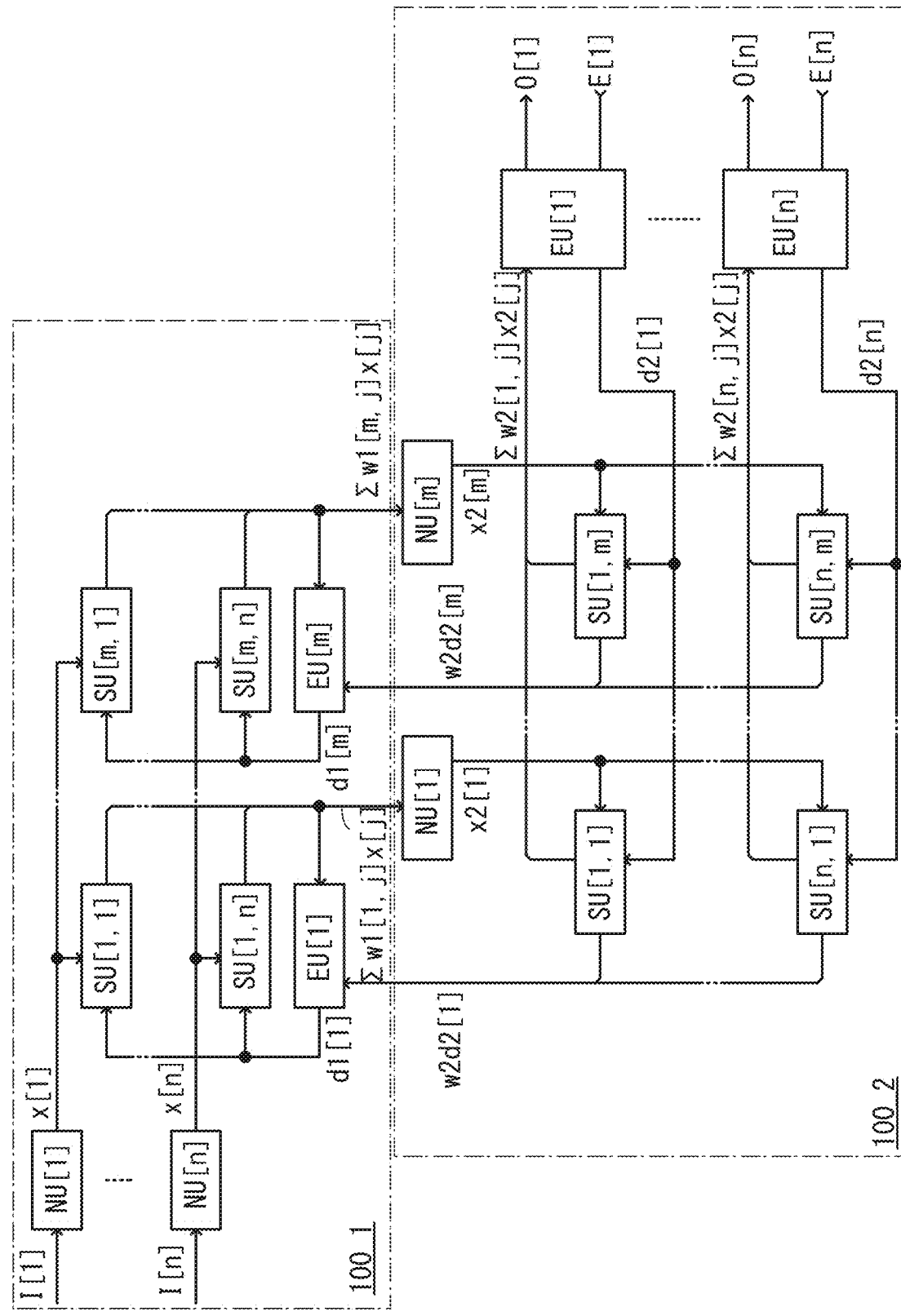
FIG. 33 illustrates an example of a block diagram.

A three-layer neural network that uses two of the module 100 illustrated in FIG. 1, that is, a neural network that includes an input stage, a hidden stage, and an output stage is described as a semiconductor device; in addition, learning in the neural network is described. A three-layer neural network that includes a first module 100_1 and a second module 100_2 is illustrated in FIG. 33. In the first module 100_1, the neuron circuit NU and the error circuit EU serve as the input neuron circuit and the hidden error circuit, respectively; in the second module 100_2, the neuron circuit NU and the error circuit EU serve as the hidden neuron circuit and the output neuron circuit, respectively. The output signal of the synapse circuit SU of the first module 100_1 serves as the input signal of the neuron circuit NU of the second module 100_2, and the error signal from the synapse circuit SU of the second module 100_2 serves as the input signal of the error circuit EU of the first module 100_1.

In the three-layer neural network, learning amounts to storing data corresponding to a weight coefficient w1[j, i] (j and i are natural numbers) of the synapse circuit SU of the first module 100_1 and a weight coefficient w2[k, j] (k is a natural number) of the synapse circuit SU of the second module 100_2 to each analog memory AM, in response to input signals I[1] to I[n], so that desired signals O[1] to O[n] can be obtained. Specifically, learning amounts to: providing a given value as an initial value to the weight coefficients w1[j, i] and w2[k, j]; providing input data used for learning to the input signals I[1] to I[n] of the input neuron circuits; providing an instructor signal as an expected value to the input signals E[1] to E[n] of the output neuron circuits; and converging the weight coefficients w1[j, i] and w2[k, j] so that a sum of squared errors of the signals O[1] to O[n] and the input signals E[1] to E[n] of the output neuron circuits is the smallest.

The sum of squared errors between the signals O[1] to O[n] and the input signals E[1] to E[n] of the output neuron circuits can be expressed as in Formula (3).

[Formula (3)]

$$E = \frac{1}{2}\sum (E[k] - O[k])^2 \qquad (3)$$

When e2[k]=E[k]−O[k] is assumed, Formula (3) can be expressed as in Formula (4).

[Formula (4)]

$$E = \frac{1}{2}\sum (e2[k])^2 \qquad (4)$$

Finding the minimum value of the sum of squared errors amounts to finding a local minimum of the weight coefficients w1[j, i] and w2[k, j], i.e., finding w1[j, i] and w2[k, j] that satisfy Formula (5) and Formula (6).

[Formula (5)]

$$\frac{\partial E}{\partial w1[j, i]} = 0 \quad (5)$$

[Formula (6)]

$$\frac{\partial E}{\partial w2[k, j]} = 0 \quad (6)$$

In other words, finding the minimum value of the sum of squared errors amounts to updating the weight coefficients w1[j, i] and w2[k, j] in accordance with the values in the left sides of Formula (5) and Formula (6).

The weight coefficient w2[k, j] follows the relationship expressed in Formula (7).

[Formula (7)]

$$\frac{\partial E}{\partial w2[k, j]} = $$
$$\frac{\partial E}{\partial e2[k]} \cdot \frac{\partial e2[k]}{\partial O[k]} \cdot \frac{\partial O[k]}{\partial Y} \cdot \frac{\partial Y}{\partial w2[k, j]} = e2[k] \cdot (-1) \cdot f'(Y) \cdot \alpha_0 x2(j) \quad (7)$$

Note that in Formula (7), Y is expressed as Y=α₀(Σw2[k, j]x2[j]−θ₀). Thus, the value of the weight coefficient w2[k, j] may be changed by an amount that corresponds to η_{w2}×e2[k]×f'(Y)×x2[j]. Note that η_{w2} is a constant.

In addition, the weight coefficient w1[i] follows a relationship expressed in Formula (8).

[Formula (8)]

$$\frac{\partial E}{\partial w1[j, i]} = \frac{\Sigma \partial E}{\partial e2[k]} \cdot \frac{\partial e2[k]}{\partial O[k]} \cdot \frac{\partial O[k]}{\partial Y} \cdot \frac{\partial Y}{\partial x2[j]} \cdot \quad (8)$$
$$\frac{\partial x2[j]}{\partial X} \cdot \frac{\partial X}{\partial w1[j, i]}$$
$$= \sum e2[k] \cdot (-1) \cdot f'(Y) \cdot \alpha_0 w2[k, j] \cdot f'(X) \cdot \alpha_H x1(i)$$

Note that in Formula (8), X and Y are expressed as X=α_H(Σw1[j, i]x1[i]−θ_H), Y=α₀(Σw2[k, j]x2[j]−θ_O). The value of the weight coefficient w1[j, i] may be changed by an amount that corresponds to η_{w1}×(Σe2[k]×f'(Y)×w2[k, j])×f'(X)×x1[i].

In the error circuit EU (output neuron circuit) of the second module 100_2, the differential amplifier 115 obtains the difference signal e2[k] between the instructor signal e[k] and the signal o[k], the differentiator circuit DV obtains the differential signal f'(Y) of the signal Y, and the multiplier circuit MUL4 obtains the result of multiplication of f'(Y) by the difference signal e2[k], which is expressed as d2[k]=e2[k]×f'(Y). Here, Y is expressed as Y=α₀(Σw2[k, j]x2 [j]−θ₀). Signal d2[k] is a signal that is output to the synapse circuit SU[k, j] of the second module 100_2.

In reaction to the input signal d2[k] from the error circuit EU[k] of the second module 100_2, the synapse circuit SU[k, j] of the second module 100_2 changes the data (weight coefficient w2[k, j]) of the analog memory AM by an amount that corresponds to dw2=d2[k]×x2[j]=e2[k]×f'(Y)×x2[j]; the result of the change can be expressed as η_{w2}×dw2=η_{w2}×e2[k]×f'(Y)×x2[j]. An output signal w2[k, j]d2[k] that is output from the synapse circuit SU[k, j] of the second module 100_2 and is input to the error circuit EU[j] of the first module 100_1 is expressed as w2[k, j]d2[k]=e2 [k]×f'(Y)×w2[k, j]. Note that the output signal w2[k, j]d2[k] corresponds to the output signal w2d2 in some cases.

The error circuit EU[j] (hidden error circuit) of the first module 100_1 takes the following signals as input signals: a signal Σw1[j, i]x1[i] which is the sum of the output signals w1[j, i]x1[i] (current) of the synapse circuit SU[j, i] of the first module 100_1, and a signal Σw2[k, j]d2[k]=Σe2[k]×f'(Y)×w2[k, j]=e1[j] which corresponds to a sum of currents expressed as w2[k, j]d2[k]=e2[k]×f'(Y)×w2[k, j], which is an output signal of the synapse circuit SU[k, j] of the second module 100_2. The error circuit EU[j] of the first module 100_1 then obtains the following signals: signal X from Σw1[j, i]x1[i] through a differential amplifier, a difference signal EX from e1[j] through the differential amplifier 103, an output signal f'(X) from signal X through the differentiator circuit DV, and a multiplication result of f'(X) and signal EX, which is expressed as d1[j]=e1[j]×f'(X)=Σe2[k]× f'(Y)×w2[k, j]×f'(X), through the multiplier circuit MUL. Here, X is expressed as X=α_H(Σw1[j, i]x1[i]−θ_H). Signal d1[j] is a signal that is output to the synapse circuit SU[j, i] of the first module 100_1.

In reaction to the input signal d1[k] from the error circuit EU[j] of the first module 100_1, the synapse circuit SU[j, i] of the first module 100_1 changes the data (weight coefficient w1[j, i]) of the analog memory AM by an amount that corresponds to dw1=d1[j]×x1[i]=Σe2[k]×f'(Y)×w2[k, j]×f'(X)×x1[i]; the amount of the change can also be expressed as η_{w1}×dw1=η_{w1}×Σe2[k]×f'Y)×w2[k, j]×f'X)×x1[i]. Note that the output signal w1[j, i]d1[j] (=wd1) of the synapse circuit SU[j, i] of the first module 100_1 is not output to other modules.

As described above, in the semiconductor device, the weight coefficients w1[j, i] and w2[k, j] can be updated. In the semiconductor device, data corresponding to the weight coefficients w1[j, i] and w2[k, j] that enables the semiconductor device to obtain a desired output signal from an input signal can be stored in each analog memory AM. That is, the semiconductor device can learn.

<Four-Layer Neural Network>

Figure 8:
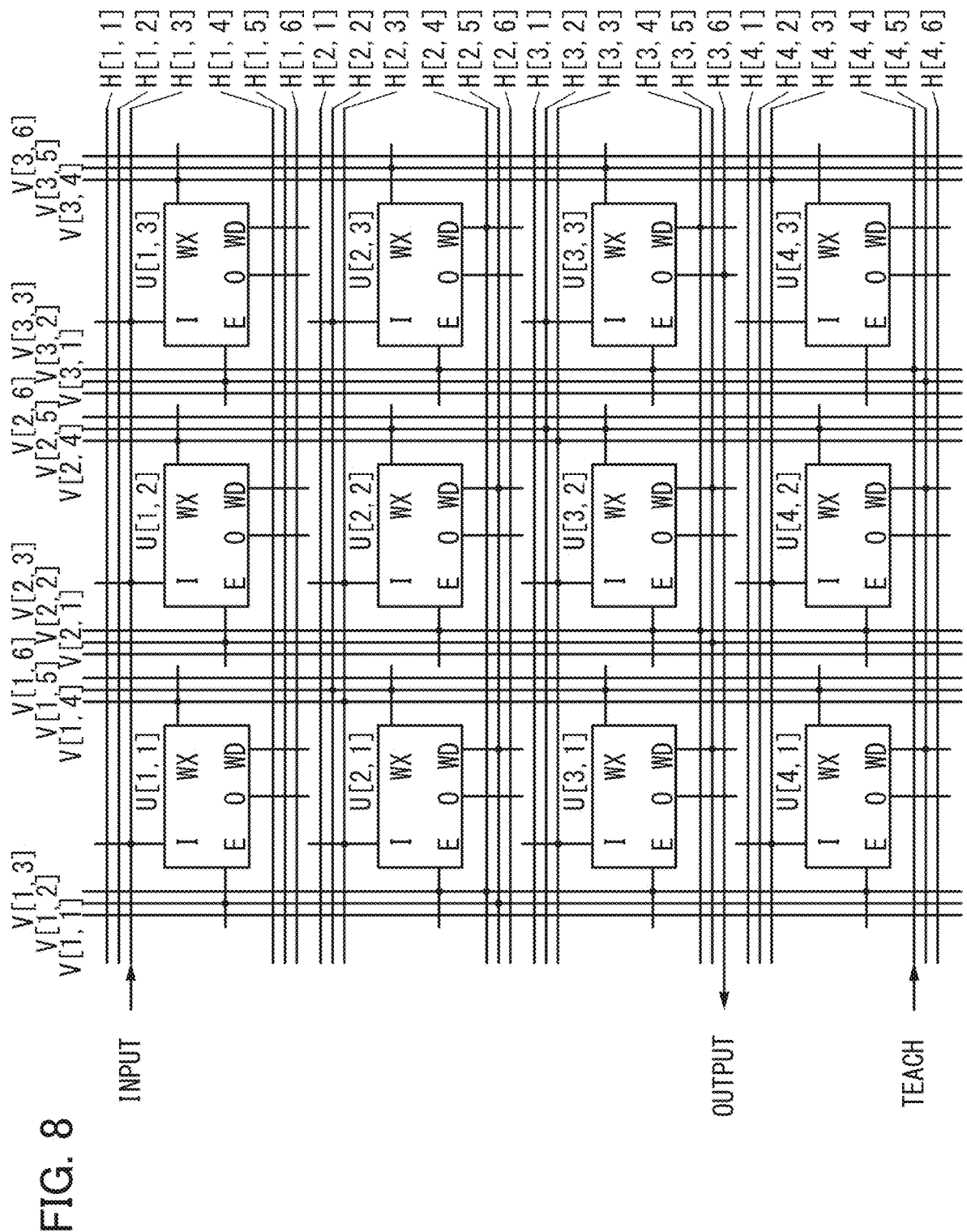
FIG. 8 illustrates an example of a circuit diagram.

FIG. 8 illustrates an example of the semiconductor device which is a four-layer neural network composed of the module 100 described above. Here, the neuron circuits NU of modules U[1, 1], U[1, 2], and U[1, 3] are the input neuron circuits, the neuron circuits NU of modules U[2, 1], U[2, 2], U[3, 1], U[3, 2], U[4, 1], and U[4, 2] are first hidden neuron circuits; the neuron circuits NU and the error circuits EU of modules U[2, 3] and U[3, 3] are second hidden neuron circuits and the output neuron circuits, respectively. The output signal wx of the synapse circuit SU of the module U[1, 1] is the input signal i of the neuron circuits NU of the modules U[2, 1] and U[2, 2]; the output signal wx of the synapse circuit SU of the module U[1, 2] is the input signal i of the neuron circuits NU in modules U[3, 1] and U[3, 2]; the output signal wx of the synapse circuit SU of the module U[1, 3] is the input signal i of the neuron circuits NU of the modules U[4, 1] and U[4, 2]; the error signal WD of the synapse circuit SU of the module U[2, 3] is the input signal E of the error circuits EU of the modules U[2, 1], U[3, 1], and U[4, 1]; and the error signal WD of the synapse circuit SU of the module U[3, 3] is the input signal E of the error circuits EU of the modules U[2, 2], U[3, 2], and U[4, 2].

Figure 9:
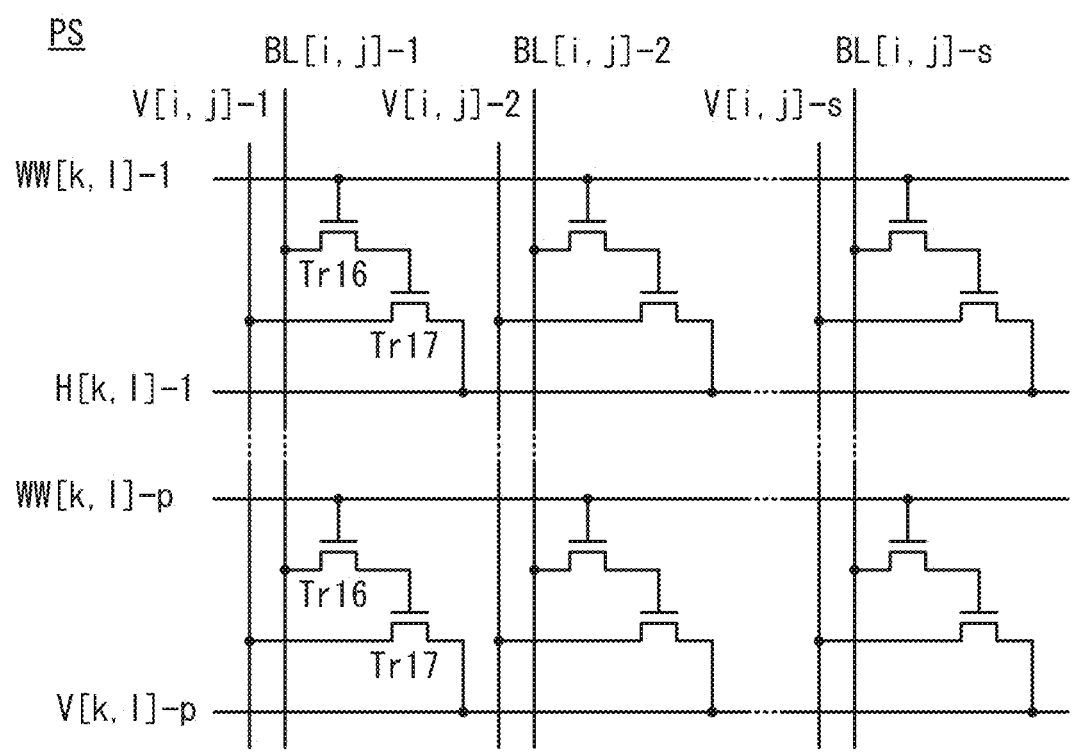
FIG. 9 illustrates an example of a circuit diagram.

Wiring groups H[1, 1] to H[4, 6]and V[1, 1] to V[3, 6], each of which are made up of a plurality of signal lines, are arranged among the modules. Programmable switches are provided at each of their intersections. The circuit configuration of a programmable switch PS is shown in FIG. 9. Note that in FIG. 8, the intersections where the programmable switches are placed have black dots placed thereupon, to denote the case in which the wiring groups are electrically connected to each other.

The programmable switch PS illustrated in FIG. 9 is made up of transistors Tr16 and Tr17; when the transistor Tr16, which includes the oxide semiconductor, is on (at which point the potential of a signal line WW is at "H"), data is stored from the signal line BL as the gate potential of the transistor Tr17, and the conduction of transistor Tr17 is controlled in accordance with the data. In other words, the programmable switch PS can be programmed to control the electrical connection between the wirings V and H.

In FIG. 8, the input signal of the semiconductor device is input to the input neuron circuits of the modules U[1, 1], U[1, 2], and U[1, 3] through the wiring group H[1, 3]. The output of the output neuron circuit of the module U[3, 3] is output through the wiring group H[3, 6] as the output signal of the semiconductor device. The instructor signal of the semiconductor device is input to the output neuron circuits of the modules U[2, 3] and U[3, 3] through the wiring groups H[4, 4] and V[3, 3].

The output signal of the synapse circuit SU of the module U[1, 1] is input to the neuron circuits NU of the modules U[2, 1] and U[2, 2] through the wiring groups V[1, 4] and H[2, 3].

The output signal of the synapse circuit SU of the module U[1, 2] is input to the neuron circuits NU of the modules U[3, 1] and U[3, 2] through the wiring groups V[2, 4] and H[3, 3].

The output signal of the synapse circuit SU of the module U[1, 3] is input to the neuron circuits NU of the modules U[4, 1] and U[4, 2] through the wiring groups V[3, 4] and H[4, 3].

The output signals of the synapse circuits SU of the modules U[2, 1], U[3, 1], and U[4, 1] are input to the neuron circuit NU of the module U[2, 3] through the wiring groups V[1, 5] and H[2, 2].

The output signals of the synapse circuits SU of the modules U[2, 2], U[3, 2] and U[4, 2] are input to the neuron circuit NU of the module U[2, 3] through the wiring groups V[2, 5] and H[3, 2].

The output signals of the synapse circuits SU of the modules U[2, 3] and U[3, 3] are shared within the wiring group V[3, 5].

The error signal of the synapse circuit SU of the module U[2, 3] is input to the error circuits EU of the modules U[2, 1], U[3, 1], and U[4, 1], through the wiring groups H[2, 4] and V[1, 3].

The error signal of the synapse circuit SU of the module U[3, 3] is input to the error circuits EU of the modules U[2, 2], U[3, 2], and U[4, 2] through the wiring groups H[3, 4], and V[2, 3].

The error signals of the synapse circuits SU of the modules U[2, 1] and U[2, 2] are input to the error circuit EU of the module U[1, 1] through the wiring groups H[2, 5] and V[1, 2].

The error signals of the synapse circuits SU of the modules U[3, 1] and U[3, 2] are input to the error circuit EU of the module U[1, 2] through the wiring groups H[3, 5], and V[2, 2].

The error signals of the synapse circuits SU of the modules U[4, 1] and U[4, 2] are input to the error circuit EU of the module U[1, 3] through the wiring groups H[4, 5] and V[3, 2].

The semiconductor device described above learns by providing the learning data as the input signal of the input neuron circuit, providing the instructor signal that corresponds to the learning data to the output neuron circuit as the input signal, and updating the data in the analog memory in accordance with the error signal. By learning, the semiconductor device becomes able to determine whether the subject data and the learning data are matching or similar when the subject data is supplied as the input signal of the input neuron circuit. Here, by using data of an object (moving object) as a subject in the image data as the learning data, the semiconductor device becomes able to detect the object in the image data. In other words, efficient pattern extraction of the moving object from the image data becomes possible, and motion-compensated prediction can be performed efficiently.

With such a structure, a semiconductor device including a hierarchical neural network architecture can be provided. The semiconductor device is configured with an analog circuit and capable of reducing the circuit size and retaining data without a refresh operation. Furthermore, in this device, the hierarchical structure such as the layer number of neurons and number of neurons within a layer can be freely changed.

Embodiment 2

In this embodiment, an operation example of the semiconductor device illustrated in FIG. 1 is described. Here, an operation of a three-layer neural network with modules 100_1 and 100_2 illustrated in FIG. 33 is described as an operation of the semiconductor device. The selector circuit is set so that the neuron circuit NU of the first module 100_1 is the input neuron circuit, the error circuit EU of the first module 100_1 is the hidden error circuit, the neuron circuit NU of the second module 100_2 is the hidden neuron circuit, and the error circuit EU of the second module 100_2 is the output neuron circuit. The output signal of the synapse circuit SU of the first module 100_1 serves as the input signal of the neuron circuit NU of the second module 100_2, and the error signal from the synapse circuit SU of the second module 100_2 serves as the input signal of the error circuit EU of the first module 100_1.

<Operation Example>

Figure 10:
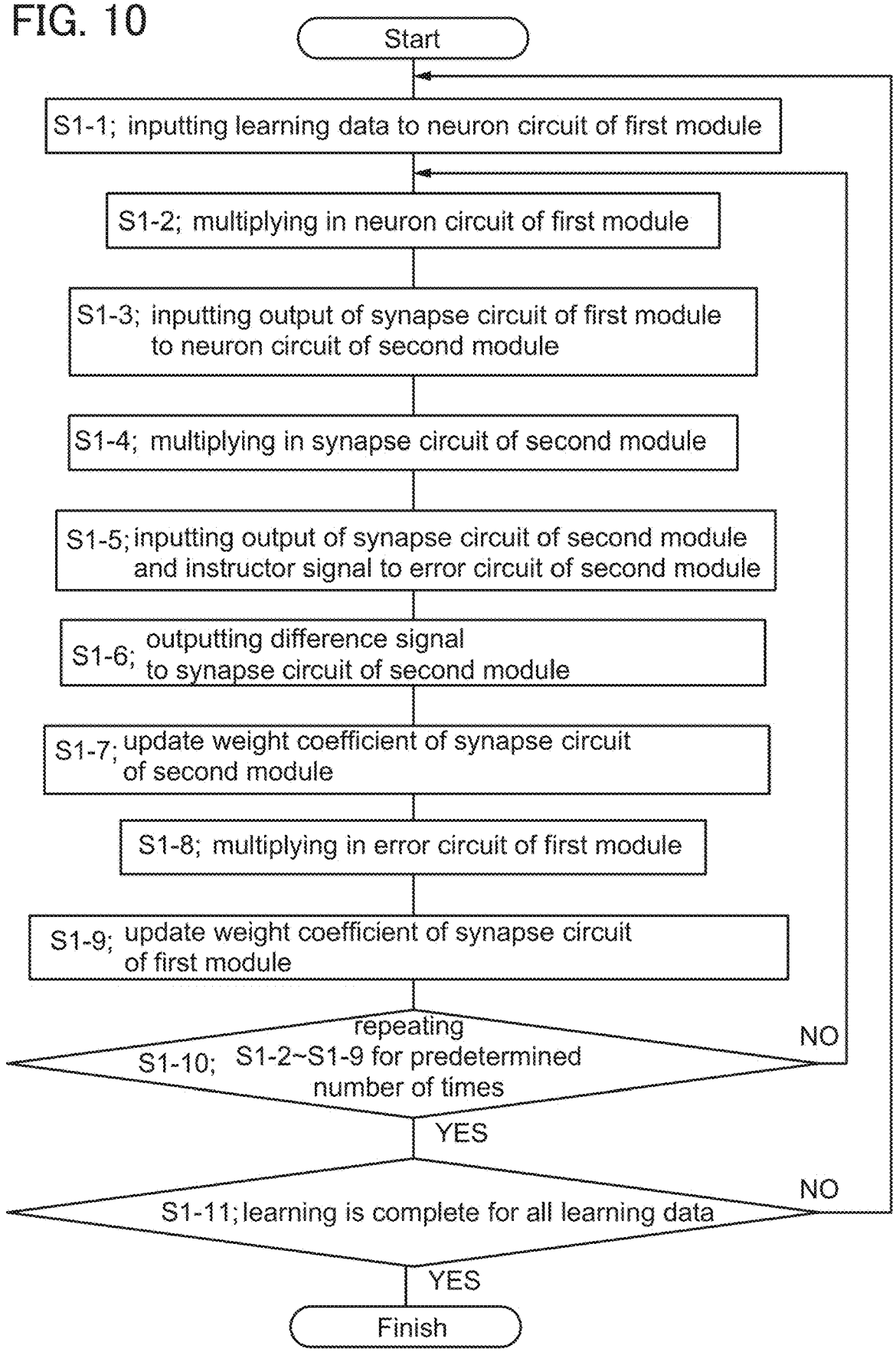
FIG. 10 illustrates an example of a flow chart.

The operation of the semiconductor device refers to an operation where the learning data is input to the semiconductor device illustrated in FIG. 1 of the embodiment above, the semiconductor device learns the learning data, the subject data is input to the semiconductor device, and the learning data and the subject data are determined to be matching, similar, or not matching. FIG. 10 and FIG. 11 are flowcharts of the operation of the semiconductor device.

<<Learning>>

First, operation where the semiconductor device illustrated in FIG. 1 learns data is described with reference to FIGS. 1 and 10.

[Step S1-1]

In Step S1-1, a learning data is input from the outside to the input neuron circuit, that is, the neuron circuit NU of the first module 100_1. Learning data corresponds to input signals I[1] to I[n] in FIG. 33. Note that learning data is represented in binary here, and the number of neuron circuits NU to which learning data is input is determined in accordance with the number of bits of the learning data. The semiconductor device preferably is configured to input data that results in a fixed value of the output signal x from the neuron circuit NU that is not needed for the input of learning data. Furthermore, the semiconductor device is preferably configured, for example, to block the power supply to the neuron circuit NU. Here, the amount of learning data is given as n bits. Learning data I[1] to I[n] are input to the neuron circuits NU[1] to NU [n], respectively.

[Step S1-2]

In Step S1-2, the output signal x from the input neuron circuit, i.e., the neuron circuit NU of the first module 100_1, is input to the synapse circuit SU of the first module 100_1. The synapse circuit SU of the first module 100_1 outputs an output signal w1x, which is a signal obtained by multiplying the output signal x with the weight coefficient w1 that is contained in the analog memory AM, to the hidden error circuit, i.e., the error circuit EU of the first module 100_1, and the hidden neuron circuit, i.e., the neuron circuit NU of the second module 100_2.

[Step S1-3]

In Step S1-3, Σw1x, which is a sum of the output signals of the synapse circuits SU of the first module 100_1, is input to the hidden neuron circuit, i.e., the neuron circuit NU of the second module 100_2.

Note that the number of hidden neuron circuits, i.e., the neuron circuits NU of the second module 100_2, may be changed in accordance with the learning data. The semiconductor device preferably is configured to input data to the neuron circuit NU that is not needed, which results in the output signal x with a fixed value. Furthermore, the semiconductor device is preferably configured to block the power supply to the neuron circuit NU described in the previous line. Here, the number of neuron circuits NU of the second module 100_2 is m;

the input of the neuron circuit NU is given as the sum of w1x[1] to w1x[m].

[Step S1-4]

In Step S1-4, an output signal x2 from the hidden neuron circuit, i.e., the neuron circuit NU of the second module 100_2, is input to the synapse circuit SU of the second module 100_2. The output signal x2 corresponds to the output signal x in FIG. 1. The synapse circuit SU of the second module 100_2 outputs an output signal w2x2, which is a signal obtained by multiplying the output signal x2 by the weight coefficient w2 stored in the analog memory AM, to the output neuron circuit, i.e., the error circuit EU of the second module 100_2. The weight coefficient w2 is a weight coefficient that is stored in the analog memory AM of the synapse circuit SU of the second module 100_2.

[Step S1-5]

In Step S1-5, Σw2x2 is input to the output neuron circuit, i.e., the error circuit EU of the second module 100_2. Σw2x2 corresponds to Σwx in FIG. 1.

[Step S1-6]

The error circuits EU[1] to EU[m] performs multiplication according to Σw2x2 and the instructor signal e that is input from the outside; the error circuits EU[1] to EU[m] then output a difference signal d2 to the neuron circuit NU of the second module 100_2. The difference signal d2 corresponds to d[1] to d[m] in FIG. 1. The instructor signal e corresponds to the input signals E[1] to E[n] that are input to the error circuits EU[1] to EU[n] of the second module.

[Step S1-7]

In Step S1-7, the weight coefficient w2 stored in the analog memory AM of the synapse circuit SU of the second module 100_2 is updated in accordance with the difference signal d2. In addition, in Step S1-7, the weight coefficient w2, which is updated in the synapse circuit SU of the second module 100_2, is multiplied by the difference signal d2; subsequently, the output signal w2d2 is output. The output signals w2d2 are output to the hidden error circuits, i.e., the error circuits EU of the first module 100_1, as the input signals E[1] to E[n].

[Step S1-8]

In Step S1-8, multiplication is performed with Σw1x, which is a sum of output signals, and the output signal w2d2, then a difference signal d1 is output to the neuron circuit NU of the first module 100_1. The difference signal d1 corresponds to d[1] to d[m] in FIG. 1.

[Step S1-9]

In Step S1-9, the weight coefficient w stored in the analog memory AM of the synapse circuit SU of the first module 100_1 is updated in accordance with the difference signal d1. After Step S1-9 is complete, Step S1-2 to Step S1-9 are repeated for a predetermined number of times in accordance with the updated weight coefficients w1 and w2.

In Step S1-10, it is determined whether Step S1-2 to Step S1-9 have been repeated for the predetermined number of times. When the number of repetitions reaches a predetermined number, the learning of the learning data is terminated.

Note that the predetermined number here is ideally set so that Step S1-2 to Step S1-9 are repeated as many times until the error between the output signal o of the error circuit EU of the second module and the instructor signal e are contained within a specified value; however, the number of repetition may be set as a given number determined by experience.

[Step S1-11]

In Step S1-11, it is determined whether learning is complete for all the learning data. When there are learning data for which learning is not complete, Step S1-1 to S1-4 10 are repeated; when learning is complete for all data, the operation is terminated. Note that the semiconductor device may be configured to perform learning on the learning data that has already been learned by the semiconductor device, after all the sequences of learning all the learning data have been completed.

In the neural network with hierarchical perceptron architecture, multiple hidden layers are preferably provided. When hidden neuron circuits and synapse circuits equivalent to hidden layers are provided in multiple layers, the weight coefficient can be updated repeatedly; the learning efficiency can thus be increased.

<<Comparison>>

Next, an operation in which the subject data is input to the semiconductor device illustrated in FIG. 33 that has learned the data beforehand and a result is output is described with reference to FIG. 11. Among a plurality of data learned here, data that are associated to be the most similar to the subject data are output as a result.

[Step S2-1]

In Step S2-1, a subject data is input from the outside to the input neuron circuit, i.e., the neuron circuit NU of the first module 100_1.

[Step S2-2]

In Step S2-2, the output signal x that corresponds to the subject data is output from the neuron circuit NU of the first module 100_1 and input to the synapse circuit SU of the first module 100_1. The synapse circuit SU of the first module 100_1 outputs the output signal w1x, which is a signal obtained by multiplying the output signal x by the weight coefficient w1 retained in the Step S1-9 of learning, to the hidden neuron circuit, i.e., the neuron circuit NU of the second module 100_2.

[Step S2-3]

In Step S2-3, $\Sigma w1x$, which is a sum of the output signals of the synapse circuits of the first module 100_1, is input to the hidden neuron circuit, i.e., the neuron circuit NU of the second module 100_2.

In Step S2-4, the output signal x2 from the hidden neuron circuit, i.e., the neuron circuit NU of the second module 100_2, is input to the synapse circuit SU of the second module 100_2. The synapse circuit SU of the second module 100_2 outputs an output signal w2x2, which is a signal obtained by multiplying the output signal x2 by the weight coefficient w2 stored in the analog memory AM, to the output neuron circuit, i.e., the error circuit EU of the second module 100_2.

In Step S2-5, $\Sigma w2x2$, which is a sum of output signals from the synapse circuit SU of the second module 100_2, is input to the output neuron circuit, i.e., error circuit EU of the second module 100_2. The output neuron circuit, i.e., the error circuit EU of the second module 100_2 outputs the output signal o.

When the learned plurality of data includes data which matches, or is very similar to the data contained in the output signal o, the data in the output signal o is the data that was supplied as the instructor signal when the learning data was learned. In other words, judgement whether learning data and subject data match, are similar, or do not match can be made.

By performing Step S1-1 to Step S1-10, and Step S2-1 to Step S2-5, the semiconductor device illustrated in FIG. 1 can learn the learning data, then output a signal that signifies whether the learning data and the subject data match or do not match. Thus, the semiconductor device illustrated in can perform processing such as pattern recognition or associative storage.

Embodiment 3

In this embodiment, an operation example where the semiconductor device described in Embodiment 1 and illustrated in FIG. 1 is used as an encoder is described.

<Example of Motion Detection of an Object>

Firstly, an example of detecting a motion of an object is described. FIGS. 12A to 12F illustrate an algorithm performed by the encoder on image data for detection of the motion of the object.

Figure 12A:
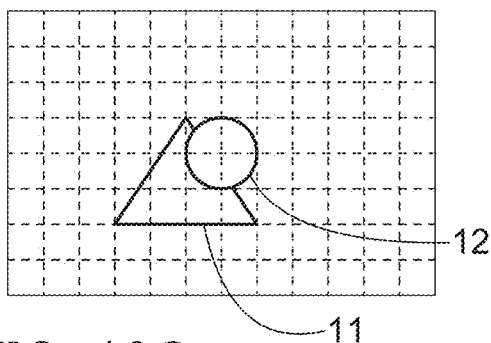
FIGS. 12A to 12F each illustrate an operation example.
Figure 12B:
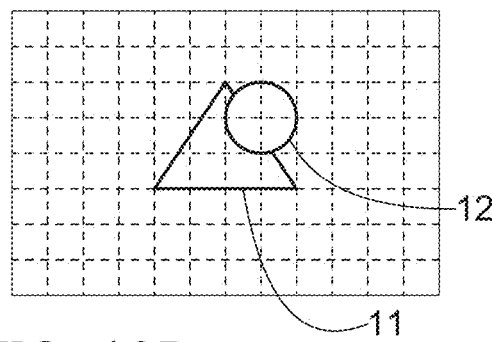

FIG. 12A shows image data 10 that has a triangle 11 and a circle 12. FIG. 12B shows image data 20 where the triangle 11 and the circle 12 of the image data 10 are moved to the upper right.

Figure 12C:
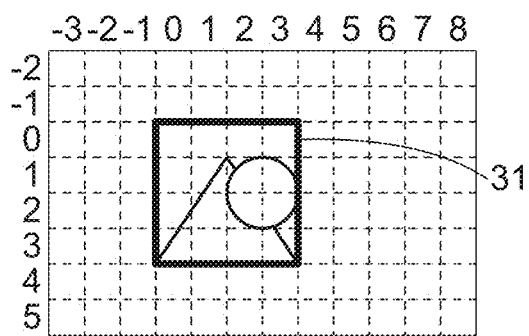

Image data 30 in FIG. 12C shows an operation by which a region 31 including the triangle 11 and the circle 12 is extracted from the image data 10. In the image data 30, a cell at the upper left corner of the extracted region 31 is regarded as a reference point (0, 0), and numbers indicating positions in the right/left and upper/lower directions are added to the image data 10. The extracted region 31 of FIG. 12C is shown in FIG. 12E.

Figure 12D:
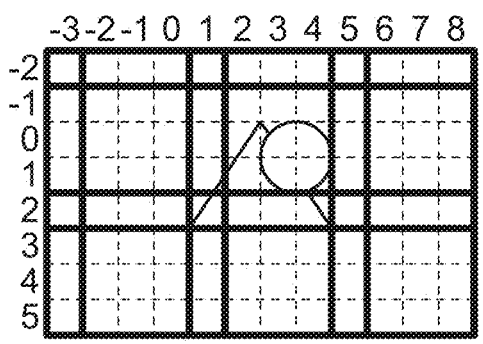
Figure 12E:
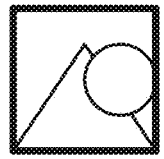
Figure 12F:
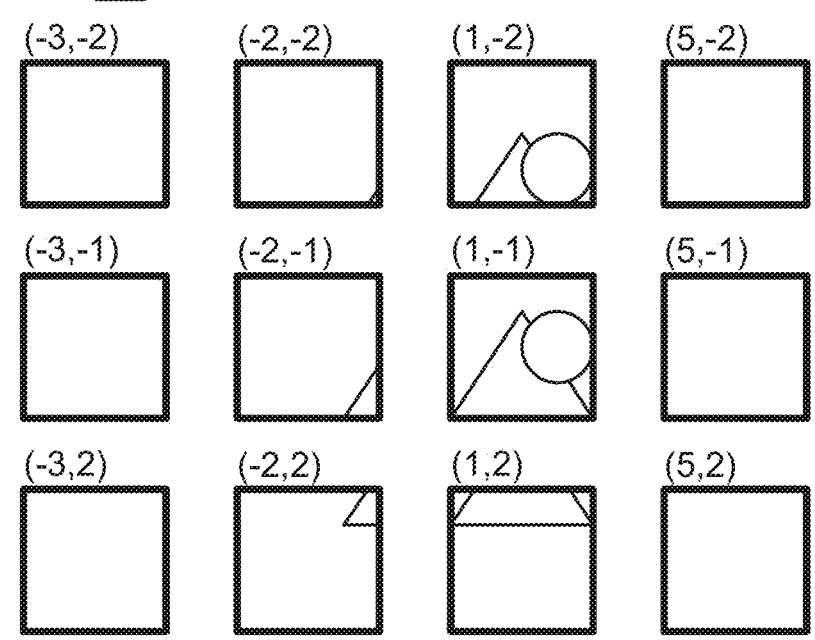

Image data 40 in FIG. 12D shows an operation by which a plurality of regions 41 are extracted from the image data 20 by cutting out regions from the image data 20. The image data 40 is image data with the numbers indicating the positions in left/right and upper/lower directions, which are added to the image data 30, are also added to the image data 20. In other words, from the image data 30 and the image data 40, the position to which the region 31 moves can be expressed with a displacement (motion vector). FIG. 12F shows some of the plurality of extracted regions 41.

After the extraction operation of the plurality of regions 41, an operation in which the plurality of regions 41 are sequentially compared with the region 31 is performed, to detect a motion of the objects. This comparison operation detects that the region 31 and the region 41 with a motion vector (1, −1) match, and the region 31 and the regions 41 with motion vectors other than the motion vector (1, −1) do not match. Accordingly, the motion vector (1, −1) from the region 31 to the region 41 can be obtained.

Note that in this specification, the data of the region 31 described above is expressed as learning data in some cases, and the data of the one of the plurality of regions 41 described above is expressed as subject data in some cases.

Although the extraction, comparison, and detection operations are performed based on the regions each formed of 4×4 cells in FIGS. 12A to 12F, the size of the regions is not limited thereto in this operation example. The size of the regions may be changed as appropriate in accordance with the size of image data to be extracted. For example, the extraction, comparison, and detection operations may be performed based on the regions each formed of 3×5 cells. Additionally, there is no limitation on the number of pixels forming a cell; for example, one cell used for forming a region may be formed of 10×10 pixels, or be one pixel. Alternatively, one cell used for forming a region may be formed of 5×10 pixels, for example.

Depending on the video content, image data contained in the region 31 may be changed. For example, the triangle 11 or the circle 12 in the region 31 may be scaled in the image data 40. Alternatively, the triangle 11 or the circle 12 in the region 31 may be rotated in the image data 40.

To achieve this, it is preferable that whether or not the region 31 and any of the plurality of regions 41 are identical be determined by characteristics extraction or the like. Motion-compensated prediction becomes possible when image data where the region 31 moves in the motion vector direction is generated from the image data of the region 31 and a difference between the generated data and the plurality of regions 41 is obtained. Furthermore, when the amount of motion of the image data in the region 31 does not coincide with an integral multiple of a pixel pitch, the semiconductor device may be configured so that signals output to the outside are calculated through the comparison of the region 31 and the plurality of regions 41, the displacement that allows for the smallest amount of difference between those output signals is inferred, and the smallest amount of difference is detected as an object's displacement (motion vector).

<Judgement Whether Image Data Match, are Similar, or do not Match>

Figure 13:
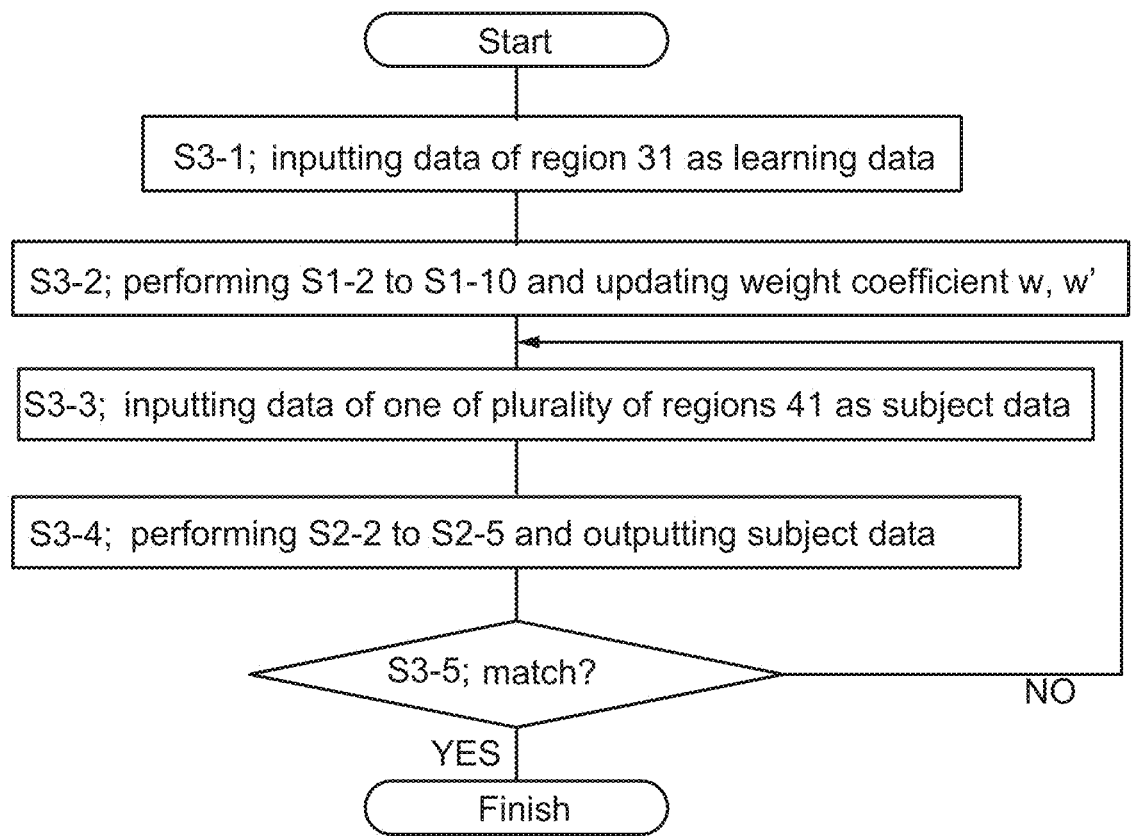
FIG. 13 illustrates an example of a flow chart.

Next, a motion-compensated prediction method using the encoder is described with reference to FIG. 13.

[Step S3-1]

In Step S3-1, the data of the region 31 is input as the learning data to the neuron circuit NU of the first module.

[Step S3-2]

In Step S3-2, operations equivalent to Step S1-2 to Step S1-10 are performed on the input data of the region 31. That is, the update of the weight coefficients of each of the synapse circuits SU is repeated, and the weight coefficient of the synapse circuit SU that corresponds to the data of the region 31 is updated.

[Step S3-3]

In Step S3-3, data of one of the plurality of regions 41 is input as the subject data to the semiconductor device illustrated in FIG. 1; this semiconductor device contains the weight coefficient that is updated in Step S3-2.

[Step S3-4]

In Step S3-4, input of the data of one of the plurality of regions 41 is performed in an operation similar to Step S2-2 to Step S2-5. In other words, by inputting data of one of the plurality of regions 41, the semiconductor device which has learned data of the region 31 outputs data that are associated therefrom.

Here, the semiconductor device determines whether or not the data of the region 31 and the data of the plurality of regions 41 match.

[Step S3-5]

In Step S3-5, the step to which the sequence will proceed is decided in reaction to the determination above.

When the data of region 31 and the data of one of the plurality of regions 41 do not match according to the determination above, Step S3-3 and Step S3-4 will be performed again taking a region 41 that is different from the one of the plurality of region 41 as the subject data.

In addition, when the data of the region 31 and the data of the one of the plurality of regions 41 match according to the determination above, the operation terminates after obtaining the motion vector of the one of the plurality of the regions 41 that uses the region 31 as a standard. By obtaining the motion vector, motion-compensated prediction using the motion vector as a difference can be performed. By performing the motion-compensated prediction, video data can be efficiently compressed.

Furthermore, the semiconductor device determines the data of the region 31 and the data of the one of the plurality of regions 41 match even when the two data are similar. When the data of the one of the plurality of regions 41 is similar to the data of the plurality of regions 41, the data of the one of the plurality of the regions 41 is determined to match with the data of the plurality of regions 41. In this case, by determining the matching degree of the data of the one of the plurality of regions 41 to the data of each of the plurality of regions 41, the change in position of the object is inferred; this position is obtained as the motion vector of the object. Then, the operation is terminated.

In addition, when all of the data of the regions 41 are compared as the subject data and there are no match or similarity between the learning data and all of the subject data in the determination, the semiconductor device assesses that the motion vector for motion-compensated prediction cannot be obtained from the data of the region 31 and the data of the plurality of regions 41; thus, the operation is terminated.

By performing the operations above, a neural network with the hierarchical perceptron architecture can be used as an encoder that compresses video data. This makes possible to achieve a highly efficient encoder that can compress a large volume of image data.

Embodiment Mode 3

In this embodiment, a broadcast system according to the disclosed invention will be described.

<Broadcasting System>

Figure 14:
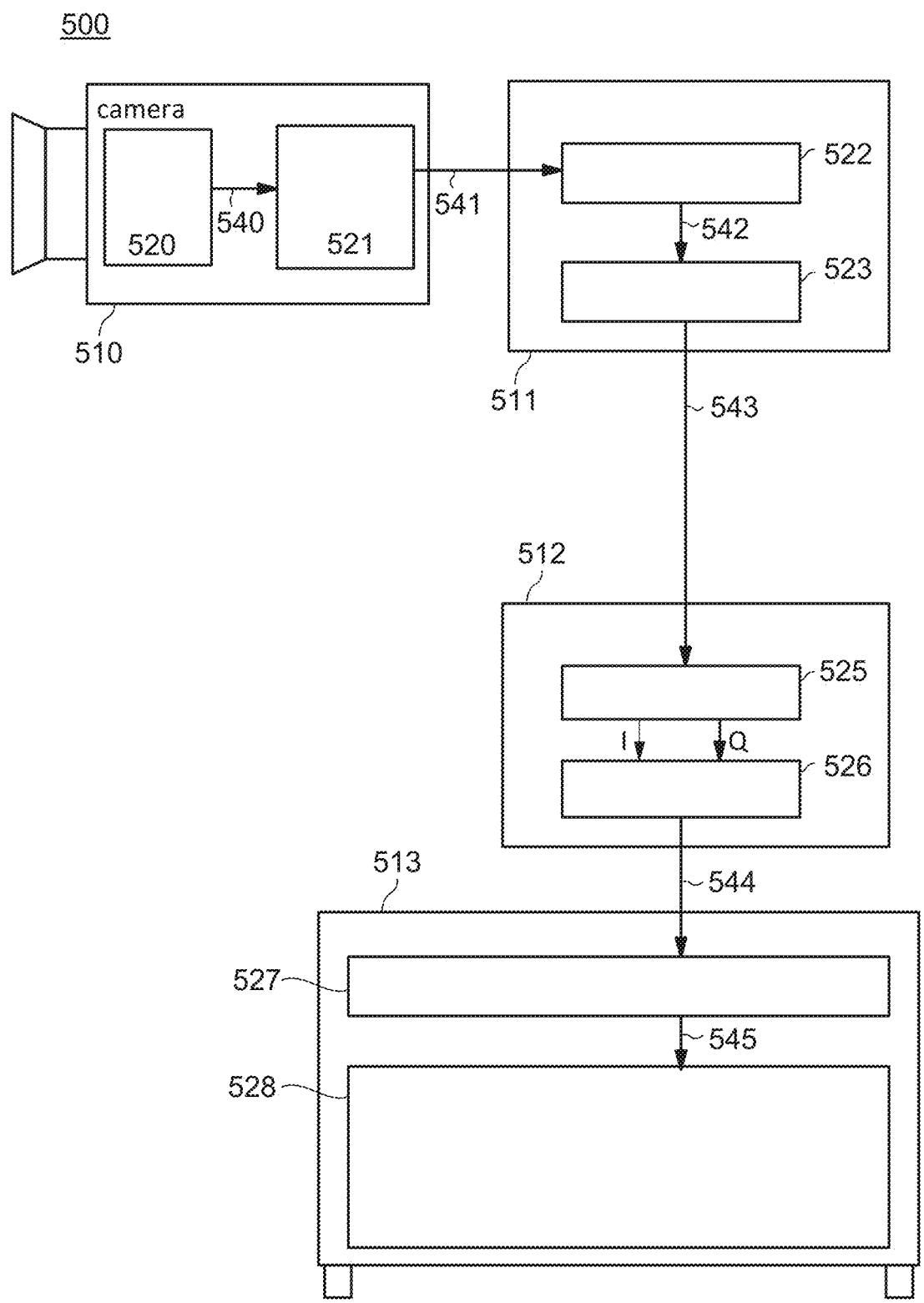
FIG. 14 illustrates an example of a block diagram.

FIG. 14 is a block diagram that schematically illustrates a configuration example of the broadcasting system. A broadcasting system 500 includes a camera 510, a transceiver 511, a receiver 512, and a display device 513. The camera 510 includes an image sensor 520 and an image processor 521. The transceiver 511 includes an encoder 522 and a modulator 523. The receiver 512 includes a demodulator 525 and a decoder 526. The display device 513 includes an image processor 527 and a display portion 528.

When the camera 510 is capable of capturing 8K video, the image sensor 520 has an adequate number of pixels for capturing a color image in 8K resolution. For example, when one pixel is made up of one red (R) subpixel, two green (G) subpixels, and one blue (B) subpixel, the image sensor 520 needs at least 7680×4320×4 [R, G+G, B] pixels; when the camera 510 is a camera for capturing 4K images, the image sensor 520 needs at least 3840×2160×4 pixels; when the camera 510 is a camera for capturing 2K images, the image sensor 520 needs at least 1920×1080×4 pixels.

The image sensor 520 generates a Raw data 540 which is unprocessed. The image processor 521 performs image processing (such as noise removal or interpolation processing) on the Raw data 540 and generates video data 541. The video data 541 is output to the transceiver 511.

The transceiver 511 processes the video data 541, and generates a broadcasting signal 543 that is compliant with a broadcasting bandwidth (the broadcasting signal may be referred to as a carrier wave in some cases). The encoder 522 processes the video data 541 and generates encoding data 542. The encoder 522 performs operations such as encoding of the video data 541, addition of data for broadcasting control (e.g. authentication data) to the video data 541, encryption, and scrambling (data rearrangement for spread spectrum).

The modulator 523 generates and outputs the broadcasting signal 543 by performing IQ modulation on the encoding data 542. The broadcasting signal 543 is a composite signal that has an I (identical phase) component and a Q (quadrature phase) component. A TV broadcasting station is tasked with obtaining the video data 541, and supplying the broadcasting signal 543.

The receiver 512 receives the broadcast signal 543. The receiver 512 has a function of converting the broadcasting signal 543 to video data 544 that can be displayed on the display device 513. The demodulator 525 demodulates the broadcasting signal 543, and decomposes the broadcasting signal 543 to two analog signals, i.e., an I signal and a Q signal.

The decoder 526 has a function of converting the I signal and the Q signal into digital signals. Moreover, the decoder 526 processes the digital signal through various methods and generates a data stream. The methods of processing performed on the digital signal include frame separation, decoding of a low density parity check (LDPC) code, separation of data for broadcasting control, descrambling, and the like. The decoder 526 decodes the data stream and generates the video data 544. Processing methods for decoding include orthogonal conversion such as discrete cosine transform (DCT) and discrete sine transform (DST), intra-frame prediction, motion-compensated prediction, and the like.

The video data 544 is input to the image processor 527 of the display device 513. The image processor 527 processes the video data 544 and generates a data signal 545 that can be input to the display portion 528. The processing performed by the image processor 527 include image processing (e.g., gamma processing), digital-analog conversion, and the like. The display portion 528 displays an image after input of the data signal 545.

Figure 15:
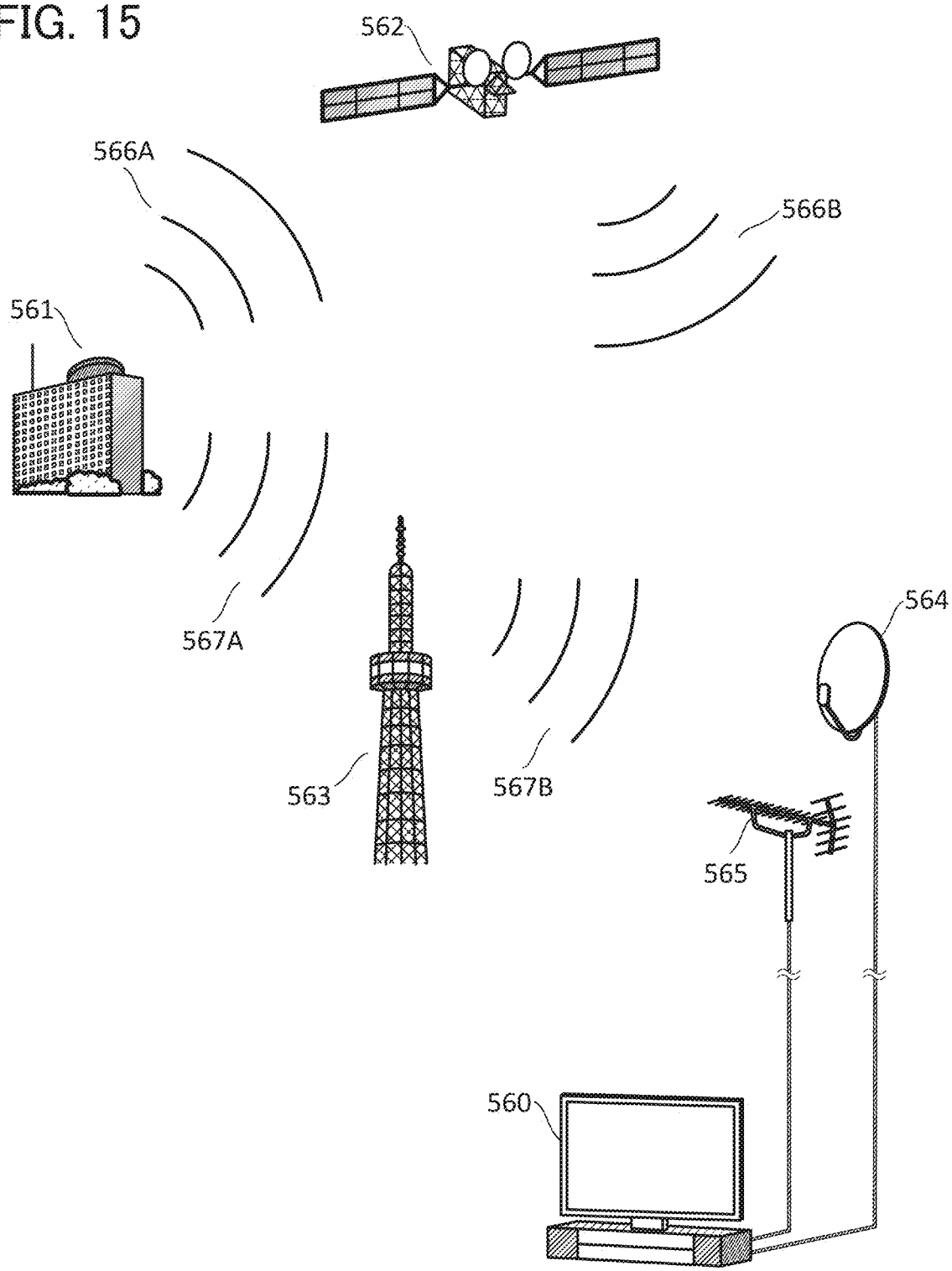
FIG. 15 illustrates an example of a schematic diagram.

A schematic representation of the data transfer within a broadcasting system is shown in FIG. 15. FIG. 15 illustrates paths that radio waves (broadcasting signals) transmitted from a broadcasting station 561 take to television receivers (TV) 560 in each household. The TV 560 is equipped with the receiver 512 and the display device 513. Examples of an artificial satellite 562 include a communication satellite (CS)

and a broadcasting satellite (BS). Examples of an antenna 564 include a BS/110° CS antenna and a CS antenna. Examples of an antenna 565 include an ultra-high frequency (UHF) antenna.

Radio waves 566A and 566B are broadcasting signals for satellite broadcasting. When the artificial satellite 562 receives the radio wave 566A, the artificial satellite 562 transmits the radio wave 566B to the ground. The radio wave 566B is received by the antenna 564 in each household, which enables the viewing of satellite TV broadcasting on the TV 560. Alternatively, the radio wave 566B is received by an antenna of another broadcasting station, where a receiver processes the radio wave 566B into a signal that can be transmitted to an optical cable. The broadcasting station then sends the broadcasting signal to the TV 560 in each household using an optical cable network. Radio waves 567A and 567B are broadcasting signals for terrestrial broadcasting. A radio tower 563 amplifies the received radio wave 567A, and transmits the radio wave 567B. Each household can view terrestrial TV broadcasting on the TV 560 by receiving the radio wave 567B with the antenna 565.

Furthermore, the video distribution system according to this embodiment is not limited to a system for TV broadcasting. In addition, the image data to be distributed may be either video data or still image data.

Figure 16:
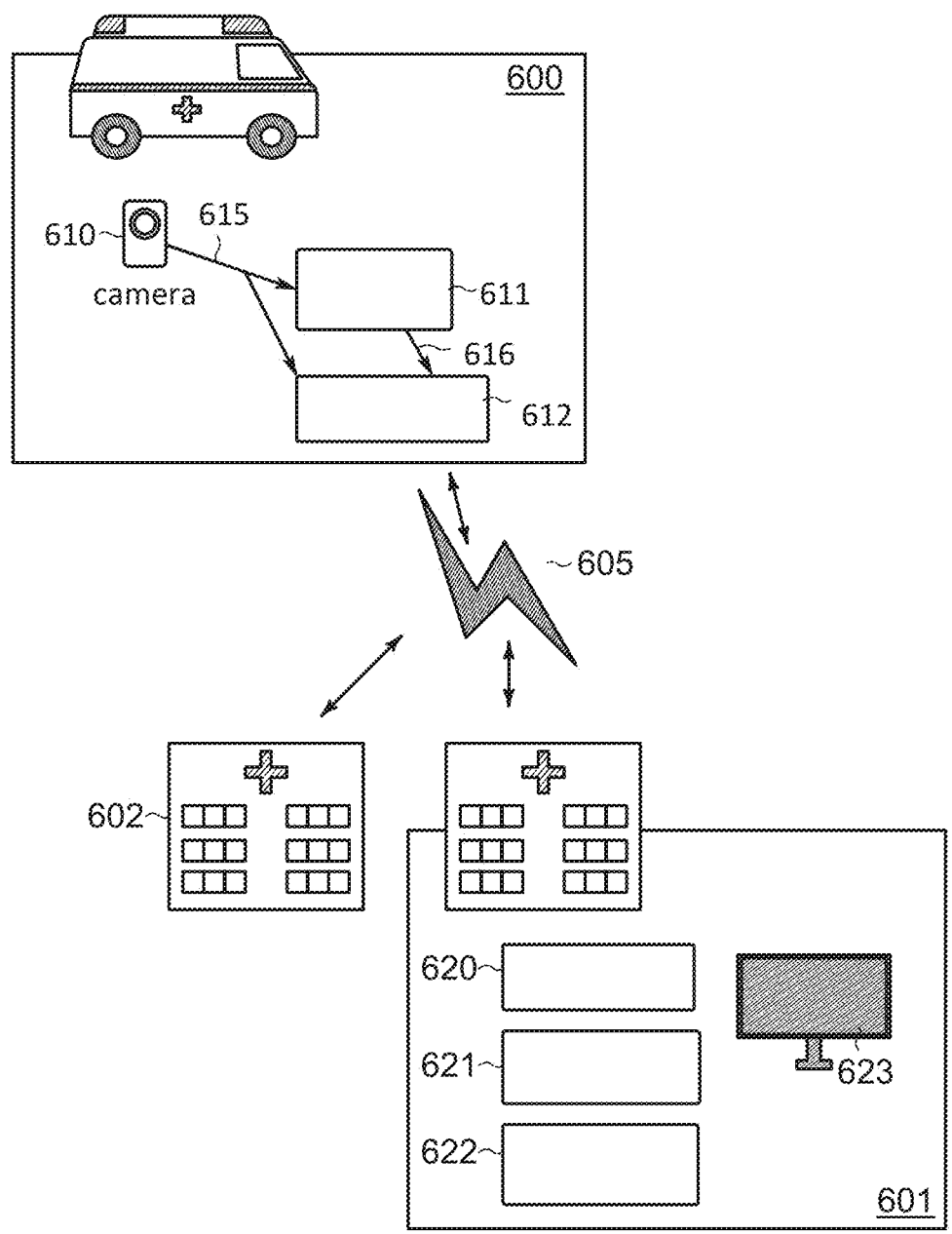
FIG. 16 illustrates an example of a video distribution system.

For example, the video data 541 of the camera 510 may be distributed through a high-speed IP network. For example, a system for distributing the video data 541 can be used in the medical field for giving out medical care and diagnoses remotely. Images with higher resolution are demanded for accurate image diagnoses and medical care; images with high resolution, such as 8K, 4K, and 2K images, are thus demanded for images for medical use. FIG. 16 schematically illustrates an emergency medical system that utilizes the video data distribution system.

The communication between an ambulance 600 and a medical institution 601 and between the medical institution 601 and a medical institution 602 are performed using a high-speed network 605. The ambulance 600 is equipped with a camera 610, an encoder 611, and a communication device 612.

The camera 610 is used to capture images of a patient being transported to the medical institution 601. Video data 615 obtained by the camera 610 may be transmitted without compression by the communication device 612. This enables the transmission of the high-resolution video data 615 to the medical institution 601 with little delay. When the high-speed network 605 cannot be used for the communication between the ambulance 600 and the medical institution 601, the video data can be encoded with the encoder 611, and encoded video data 616 can be transmitted.

In the medical institution 601, the video data transmitted from the ambulance 600 is received by a communication device 620. When the received video data is uncompressed data, the video data is transmitted through the communication device 620 to the display device 623, where the video data is displayed. When the video data is compressed data, the data is decompressed in a decoder 621, and then is transmitted to the display device 623, where the video data is displayed. Medical practitioners give instructions to a crew of the ambulance 600, or to staff members in the medical institution 601 who treat the patient, based on the image on the display device 623. The distribution system illustrated in FIG. 16 can transmit high-resolution images; this allows the medical practitioners in the medical institution 601 to inspect the patient being transported in detail. This allows the medical practitioners to give instructions that are more precise to the crew of the ambulance 600 and the staff members of the medical institution 601; this allows the improvement of the survival rate of the patients.

The communication of video data between the medical instituitions 601 and 602 is similar to that described above. The medical images obtained with an image diagnosis tool such as CT, and MRI in the medical institution 601 can be transmitted to the medical institution 602. Here, the ambulance 600 is used as an example. However, the methods for transporting the patient may be aircrafts such as helicopters, or ships.

Figure 17A:
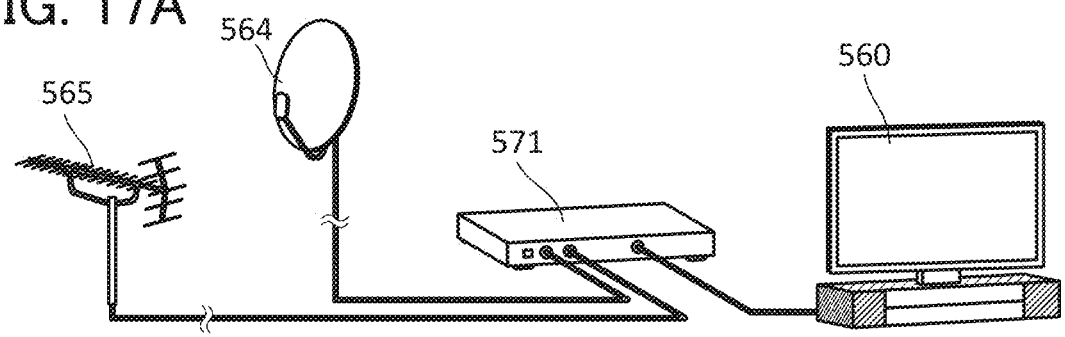
FIGS. 17A to 17D each illustrate an example of a receiver device.
Figure 17B:
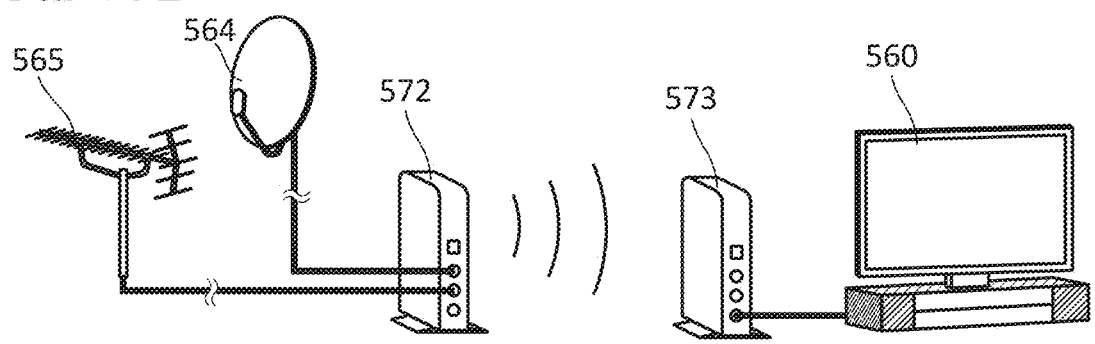
Figure 17C:
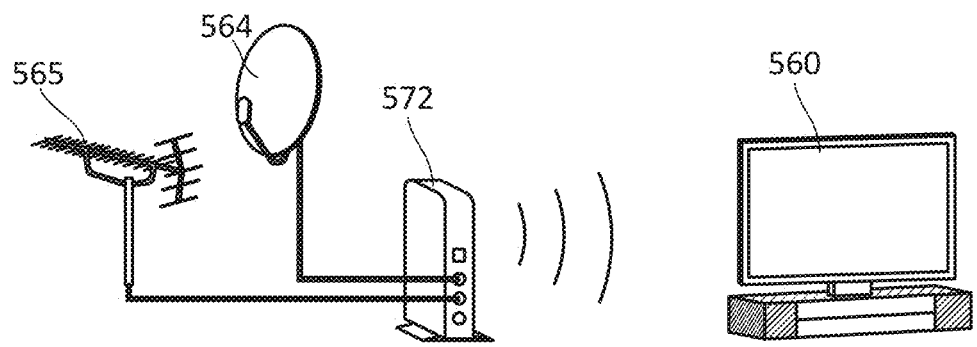
Figure 17D:
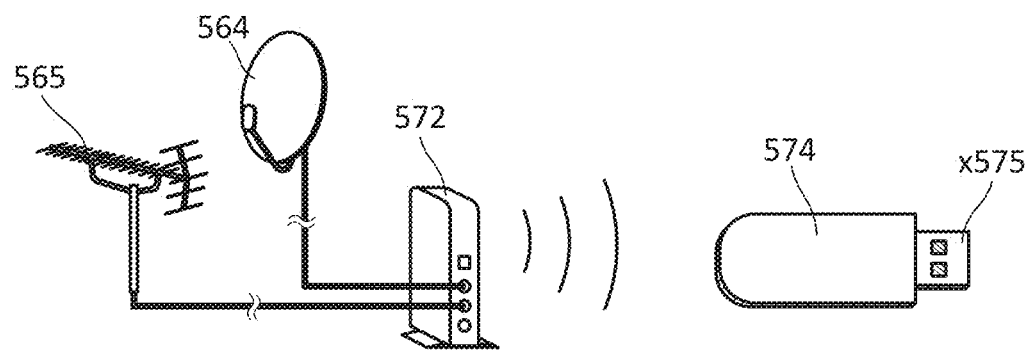

FIG. 15 illustrates an example in which a receiver is included in the TV 560. A configuration in which a standalone receiver is used to receive signals to display images on the TV 560 is also possible. An example of such a case is shown in FIGS. 17A to 17D. As illustrated in FIG. 17A, a receiver 571 may be provided on the outside of the TV 560. As illustrated in FIG. 17B, the antennae 564 and 565 and the TV 560 may transmit data to, and receive data from each other through wireless transmitters 572 and 573. In this case, the wireless transmitters 572 and 573 also serve as receivers. As illustrated in FIG. 17C, the wireless transmitter 573 may be incorporated in the TV 560.

The receiver can be of a portable size. A receiver 574 illustrated in FIG. 17D includes a connector portion 575. If an electronic device such as a display device or an information terminal (e.g., a personal computer, a smartphone, a cellular phone, and a tablet-type terminal) is equipped with a terminal that is capable of connecting with the connector portion 575, they can be used to watch satellite and terrestrial broadcasting.

The semiconductor device described in Embodiment 1 may be applied to the encoder 522 in the broadcasting system 500 illustrated in FIG. 14. In addition, the encoder 522 may have a configuration including a combination of the semiconductor device and a dedicated IC, a processor such as a graphical processing unit (GPU) or a central processing unit (CPU).

Furthermore, the encoder 522 may be integrated into one dedicated IC chip.

<Encoder>

Figure 18:
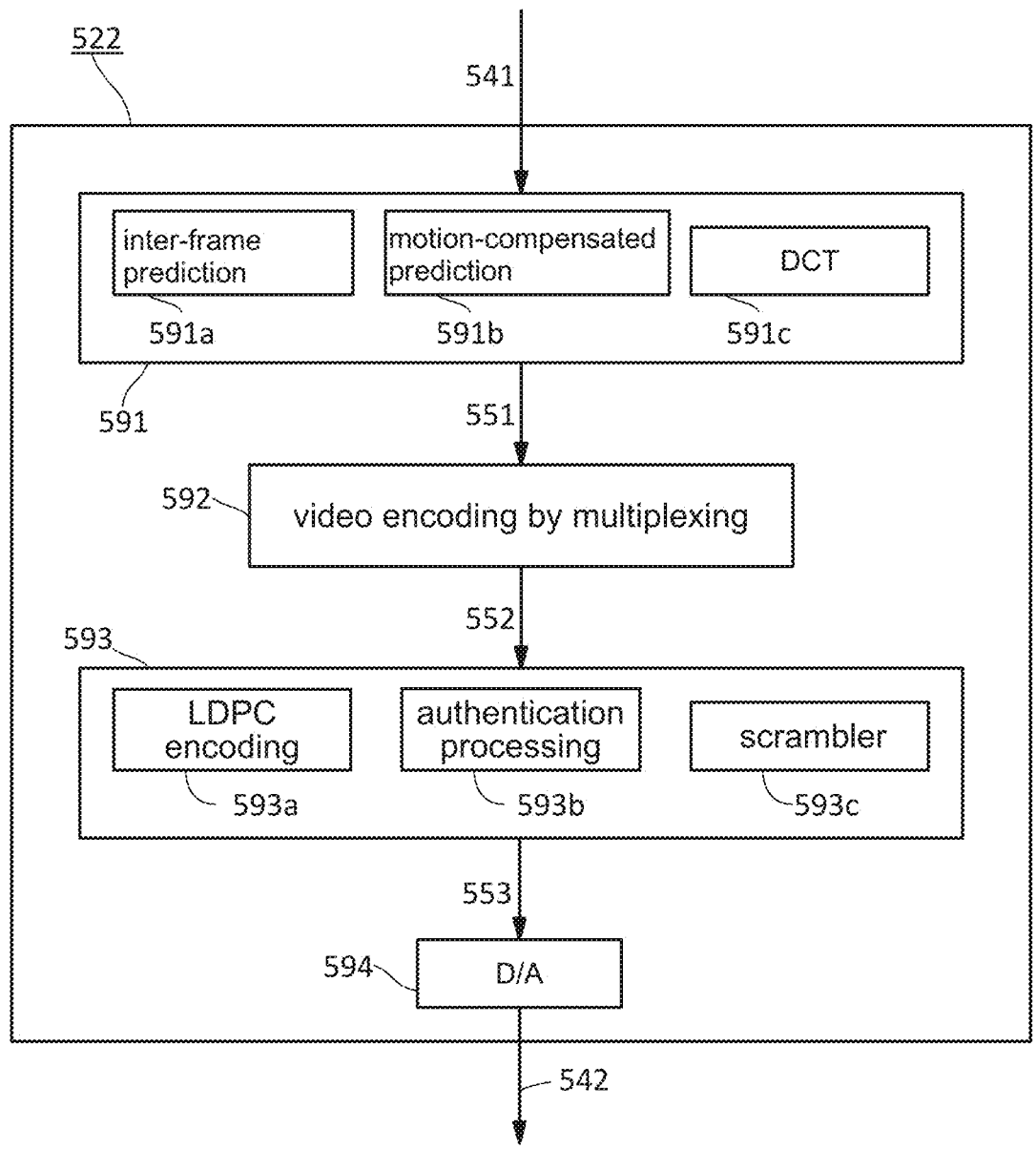
FIG. 18 illustrates an example of a block diagram.

FIG. 18 is a block diagram that illustrates an example of the encoder 522. The encoder 522 includes circuits 591 to 594.

The circuit 591 performs source encoding, and includes an inter-frame prediction circuit 591a, a motion-compensated prediction circuit 591b, and a DCT circuit 591c. The circuit 592 includes a circuit for video encoding by multiplexing. The circuit 593 includes a low density parity check (LDPC) encoding circuit 593a, an authentication processing circuit 593b, and a scrambler 593c. The circuit 594 is a digital-analog conversion (DAC) portion.

The circuit 591 performs source encoding on the video data 541 that has been transmitted. Source encoding refers to a process in which a redundant component included in image information is removed. Note that original video data cannot be completely restored from the data output from the circuit 591; it can thus be said that source encoding is an irreversible process.

The inter-frame prediction circuit 591a creates a prediction frame from a frame before the frame subject to encoding, or a frame after the frame subject to encoding, or both, thereby encoding the prediction frame. The motion-compensated prediction circuit 591b detects the motion and deformation of the subject within the video data 541, calculates the displacement and the amount of rotation and expansion and contraction, and creates a prediction frame of the frame that includes the subject, thereby encoding the prediction frame. The DCT circuit 591c uses discrete cosine transform to convert information obtained in the pixel region that corresponds to the video data to information in a frequency region.

The circuit 591 has a function of quantization of the source-encoded video data 541 through the inter-frame prediction circuit 591a, the motion-compensated prediction circuit 591b, and the DCT circuit 591c. Here, quantization means an operation in which frequency components obtained with the DCT circuit 591c are each coordinated with a discrete value. This operation can reduce large data included in the video data 541. Furthermore, the circuit 591 sends a data stream 551, which includes video data that has been source-encoded and quantized, and information that is obtained by motion-compensated prediction, to the circuit 592.

The circuit 592 is a circuit in which the information included in the data stream 551 is compressed by variable-length coding, then is multiplexed. Here, multiplexing refers to a process in which a plurality of pieces of information are aligned so that they can be transmitted as one bit string or one byte string. The information subjected to video encoding for multiplexing is transmitted to the circuit 593 as a data stream 552.

The circuit 593 mainly performs error-correction encoding, authentication processing, and encryption on the data stream 552 which is transmitted from the circuit 592. The LDPC encoding circuit 593a transmits data through noisy communication channels by performing error correction encoding. The authentication processing circuit 593b adds a code for identification (ID), a password, or the like to the data to be transmitted so that the data cannot be recovered by unintended receivers. The scrambler 593c is equipment that converts the transmission data column of data to be transmitted to a random column that is not related to a signal data column. The converted data can be recovered to the original data by descrambling at a receiver side.

The circuit 593 performs error correction encoding, authentication processing, and encryption on the data stream 552; the resulting data is transmitted to the circuit 594 as the data stream 553.

The circuit 594 is a circuit for digital-analog conversion of the data stream 553, to transmit the data stream 553 to the receiver 512. The data stream 553 after digital-to-analog conversion is transmitted to the modulator 523 as the encoded data 542.

Embodiment 5

Described in this embodiment are transistors of one embodiment of the disclosed invention.

Transistors according to one embodiment of the present invention each preferably include an nc-OS or a CAAC-OS, which are described in Embodiment 5.

<Structure Example 1 of Transistor>

FIGS. 19A to 19C are a top view and cross-sectional diagrams of a transistor 1400a. FIG. 19A is a top view. FIG. 19B is a cross-sectional diagram taken along dashed-dotted line A1-A2 in FIG. 19A, and FIG. 19C is a cross-sectional diagram taken along dashed-dotted line A3-A4 in FIG. 19A. Note that for simplification of the drawing, some components in the top view in FIG. 19A are not illustrated. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 touching top and side surfaces of the metal oxide 1432, a conductive film 1423 also touching top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 touching the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. Similarly, the region 1442 contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

Similarly, the conductive film 1424 is configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 19C, the side surface of the metal oxide 1432 is surrounded by the conductive film 1411. With this structure, the metal oxide 1432 can be electrically surrounded by an electric field of the conductive film 1411. A structure in which a semiconductor is electrically surrounded by an electric field of a gate electrode is referred to as a surrounded channel (s-channel) structure. Therefore, a channel is formed in the entire metal oxide 1432 (bulk). In an s-channel structure, a large amount of current can flow between a source and a drain of a transistor, so that the transistor can have a high on-state current.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening formed in the insulating film 1405 or the like, that is, in a self-aligned manner.

As shown in FIG. 19B, the conductive films 1411 and 1422 have a region where they overlap with each other with the insulating film positioned therebetween. Similarly, the conductive films 1411 and 1423 have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 20A:
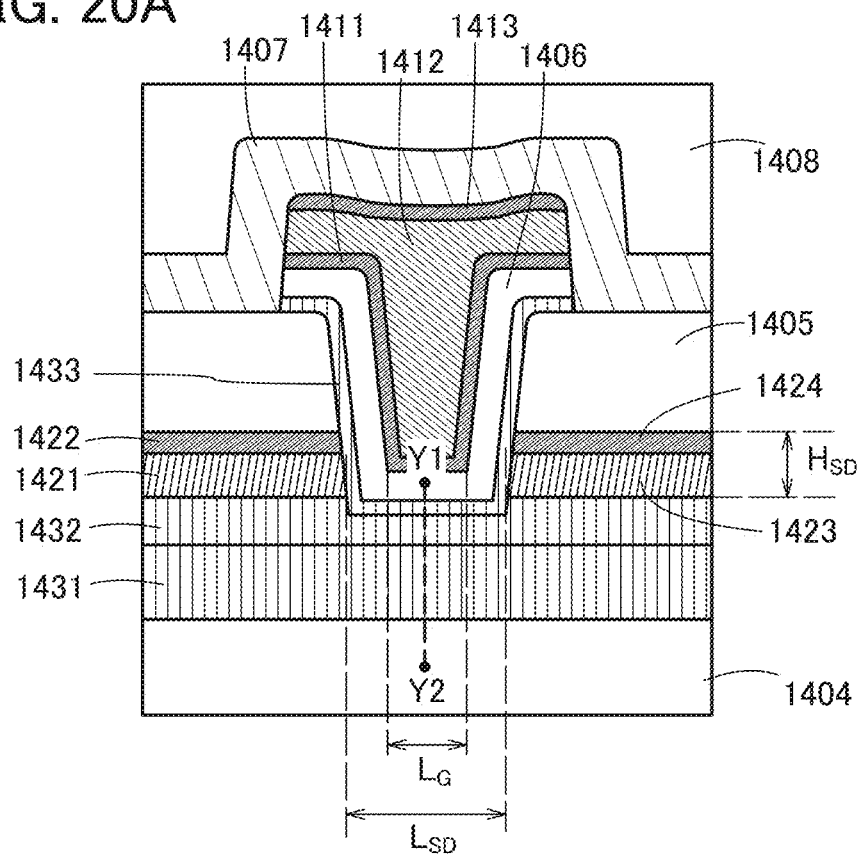
FIG. 20A illustrates an example of a cross-sectional diagram.

FIG. 20A is an enlarged view of the center of the transistor 1400a. A width $L_G$ denotes the length of the region in the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 20A, a width $L_{SD}$ indicates the length between the conductive films 1421 and 1423. The width $L_{SD}$ is the length between the source electrode and the drain electrode.

In general, the width $L_{SD}$ is determined by the minimum feature size. As shown in FIG. 20A, the width $L_G$ is narrower than the width $L_{SD}$. This signifies that in the transistor 1400a, the line width of the gate electrode can be made smaller than the minimum feature size. Specifically, the width $L_G$ can be greater than or equal to 5 nm and less than or equal to 60 nm, preferably greater than or equal to 5 nm and less than or equal to 30 nm.

In FIG. 20A, a height Hsu is the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably larger than or equal to three times, and further preferably larger than or equal to five times the thickness of the insulating film 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described.

The transistor 1400a preferably has a low current (off-state current) flowing between a source and a drain when the transistor 1400a is in an off state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later in Embodiment 6.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, and more preferably lower than 25 atomic % and higher than 75 atomic %, respectively. When the metal oxide 1431 is formed by a sputtering method, a sputtering target with the above composition is preferably used. For example, the atomic ratio of In to M to Zn in the metal oxide 1431 is preferably 1:3:2 or in the neighborhood of 1:3:2, or 1:3:4 or in the neighborhood of 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with the above composition is preferably used. For example, the atomic ratio of In to M to Zn in the metal oxide 1432 is preferably one of the following ratios: 1:1:1 or in the neighborhood of 1:1:1, 1:1:1.2 or in the neighborhood of 1:1:1.2, 2:1:3 or in the neighborhood of 2:1:3, 3:1:2 or in the neighborhood of 3:1:2, and 4:2:4.1 or in the neighborhood of 4:2:4.1. In particular, when a sputtering target with an atomic ratio of In to Ga to Zn of 4:2:4.1 is used, the atomic ratio of In to Ga to Zn in the metal oxide 1432 may be in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, the atomic ratio of In to M to Zn in the metal oxide 1433 preferably is 1:3:2 or in the neighborhood of 1:3:2, or 1:3:4 or in the neighborhood of 1:3:4. The metal oxide 1433 may be a metal oxide that is of the same type as the metal oxide 1431.

The metal oxide 1431 or the metal oxide 1433 does not need to contain indium in some cases. For example, the metal oxide 1431 or the metal oxide 1433 may be gallium oxide.

Figure 20B:
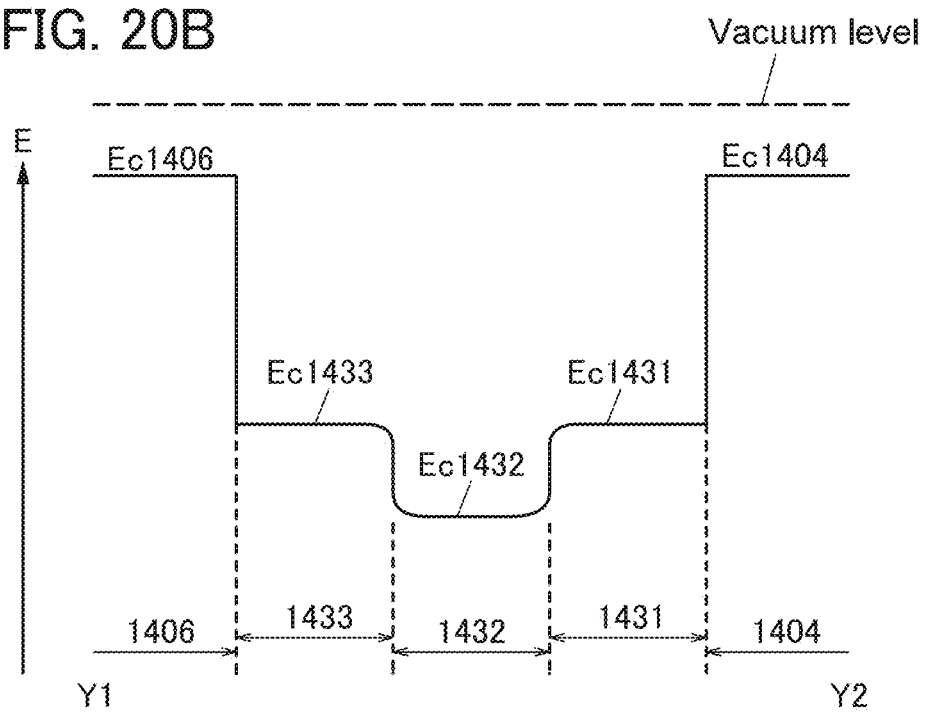
FIG. 20B illustrates an example of an energy band diagram.

Next, the function and effect of the metal oxide 1430, which includes a stack of the metal oxides 1431 to 1433, are described with reference to the energy band diagram of FIG. 20B. FIG. 20B illustrates the energy band structure of a section signified by the dashed-dotted line $Y_1$-$Y_2$ in FIG. 20A. Furthermore, FIG. 20B illustrates the energy band structure of the channel formation region and the vicinities thereof in the transistor 1400a.

In FIG. 20B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

An indium gallium oxide has a small electron affinity and an excellent oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the metal oxide 1432 having the highest electron affinity among the metal oxides 1431 to 1433.

Thus, electrons move mainly in the metal oxide 1432, not in the metal oxides 1431 and 1433. Hence, the on-state current of the transistor hardly varies even when the density of interface states, which inhibit electron movement, is high at the interface between the metal oxide 1431 and the insulating film 1404 or at the interface between the metal oxide 1433 and the insulating film 1406. The metal oxides 1431 and 1433 function as an insulating film.

In some cases, there is an mixed region of the metal oxides 1431 and 1432 between the metal oxides 1431 and 1432. Furthermore, in some cases, there is a mixed region of the metal oxides 1432 and 1433 between the metal oxides 1432 and 1433. The mixed region has a low interface state density. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited, for example, in the case where the density of defect states is high in a region where a channel is formed. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_O H$ in the following description in some cases. $V_O H$ is a factor of decreasing the on-state current of the transistor because $V_O H$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 may have a region with a thickness of less than 10 nm, preferably less than or equal to 5 nm, or more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, the metal oxide 1431 is preferably thick and the metal oxide 1433 is preferably thin. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the metal oxide 1431 and the adjacent insulator to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of silicon can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at more than or equal to 10 ppm, more than or equal to 1%, or more than or equal to 10%. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at more than or equal to 10 ppm, more than or equal to 1%, or more than or equal to 10% in order to compensate for the desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors shown as examples of the metal oxides 1431 to 1433 may be provided over or under the metal oxide 1431 or over or under the metal oxide 1433, i.e., a four-layer structure may be employed. Further alternatively, an n-layer structure (n is an integer of greater than or equal to 5) in which any one of the semiconductors shown as examples of the metal oxides 1431 to 1433 is provided at two or more of the following positions may be employed: over the metal oxide 1431, under the metal oxide 1431, over the metal oxide 1433, and under the metal oxide 1433.

<Substrate>

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Another example of the semiconductor substrate is a silicon-on-insulator (SOI) substrate, where an insulator region is provided in the above semiconductor substrate. Examples of the conductor substrate include a graphite substrate, a metal substrate, an alloy substrate, and a conductive resin substrate. Other examples of the conductor substrate include a substrate including a metal nitride and a substrate including a metal oxide. Furthermore, an insulator substrate provided with a conductor or a semiconductor, a semiconductor substrate provided with a conductor or an insulator, a conductor substrate provided with a semiconductor or an insulator, or the like may be used. Alternatively, any of these substrates over which an element is provided may be used. As the element provided over the substrate, a capacitor, a resistor, a switching element, a light-emitting element, a memory element, or the like is used.

A flexible substrate may be used as the substrate 1450. Examples of a method for providing a transistor over a flexible substrate include fabricating the transistor over a non-flexible substrate, separating the transistor, and transferring the transistor to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 400 may have a property of not returning to its original shape. The thickness of the substrate 1450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 1450 is thin, the semiconductor device can be made lightweight. By making the substrate 1450 thin, the substrate 1450 may have elasticity or the property of returning to its original shape when bending or pulling is stopped, even when glass or the like is used as the substrate 1450. This can alleviate an impact applied to the semiconductor device over the substrate 1450 which is caused by dropping or the like. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<Base Insulating Film>

The insulating film 1401 has a function of electrically isolating the substrate 1450 from the conductive film 1414.

The insulating film 1401 or 1402 is formed using an insulating film having a single-layer structure or a layered structure. Examples of the material of the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material that releases some of its oxygen by heating. The insulating film 1404 preferably contains an oxide containing oxygen more than that in the stoichiometric composition. An oxide film containing more oxygen than that in the stoichiometric composition releases some of its oxygen by heating. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing more oxygen than that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 may be formed in an oxygen atmosphere, for example. Alternatively, a region containing excess oxygen may be formed by introducing oxygen into the insulating film 1404 that has been formed. These two methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. The oxide insulating film is formed using aluminum oxide, aluminum oxynitride, gallium oxide, gallium oxynitride, yttrium oxide, yttrium oxynitride, hafnium oxide, and hafnium oxynitride.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductive layers are preferably formed using a Cu—Mn alloy, since in that case, manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductive layers are preferably formed using a Cu—Mn alloy, since in that case, manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Low-Resistance Region>

The regions 1441 and 1442 are formed when, for example, the conductive films 1421 and 1423 take oxygen from the metal oxides 1431 and 1432. Oxygen is more likely to be extracted at a higher temperature. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, an oxynitride containing aluminum and hafnium, an oxide containing silicon and hafnium, or an oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 an prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. The oxide insulating film is formed using aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 21A:
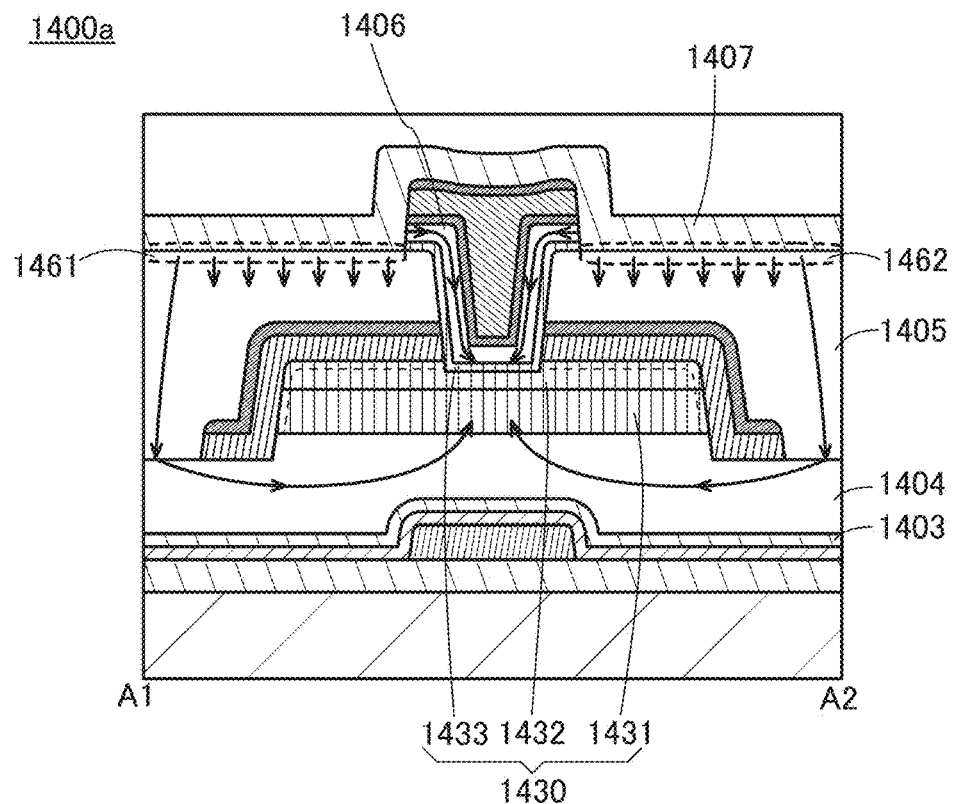
FIGS. 21A and 21B are cross-sectional diagrams illustrating oxygen diffusion paths.
Figure 21B:
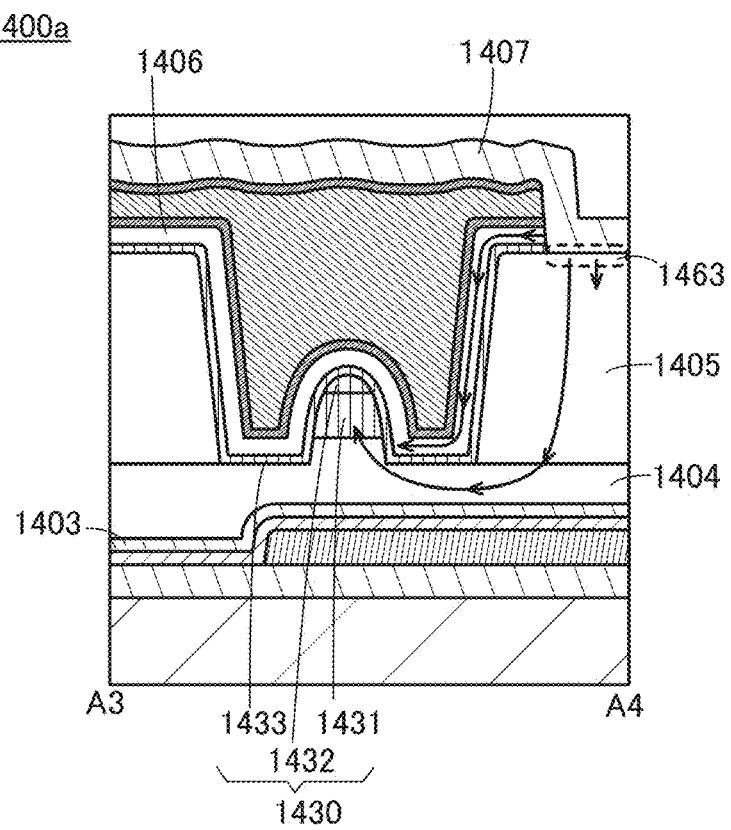

In schematic views of FIGS. 21A and 21B, oxygen added to the insulating films 1405 and 1406 during the formation of the insulating film 1407 is diffused in the insulating films through the second heat treatment and reaches the metal oxide 1430. In FIG. 21A, oxygen diffused in the cross-sectional diagram of FIG. 19B is indicated by arrows. Similarly, in FIG. 21B, oxygen diffused in the cross-sectional diagram of FIG. 19C is indicated by arrows.

As shown in FIGS. 21A and 21B, oxygen added to the side surface of the insulating film 1406 is diffused in the insulating film 1406 and reaches the metal oxide 1430. In addition, a region 1461, a region 1462, and a region 1463 each containing excess oxygen may be formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused upward across the insulating film 1407. The insulating film 1403 also has a function of blocking oxygen and prevents oxygen from being diffused downward across the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen may be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted in the transistor 1400a shown in FIGS. 19A to 19C. An example of such a structure is shown in FIGS. 22A to 22C.

Figure 22A:
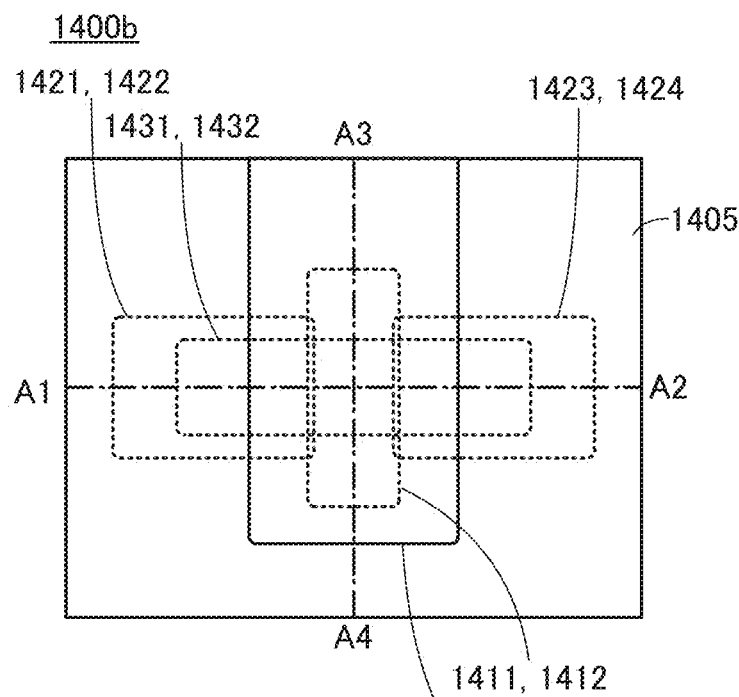
FIG. 22A illustrates an example of a top view, and FIGS. 22B and 22C each illustrate an example of a cross-sectional diagram.
Figure 22B:
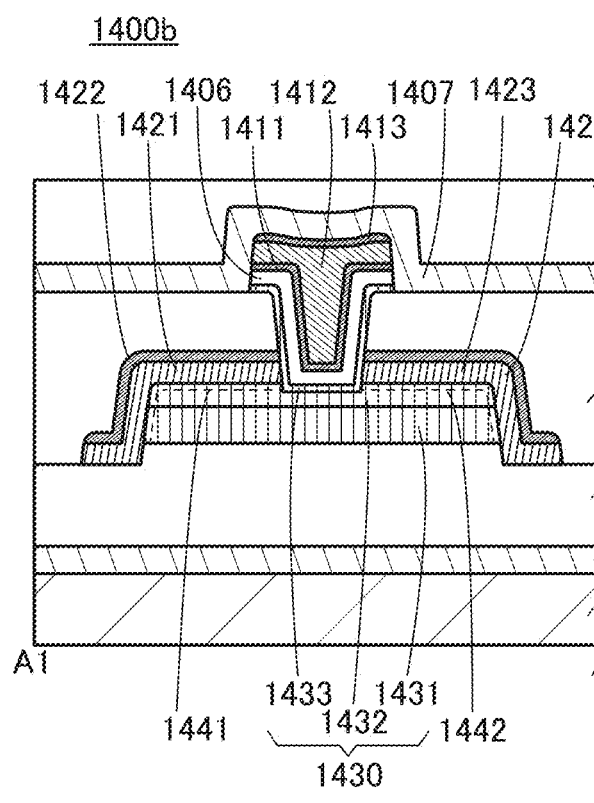
Figure 22C:
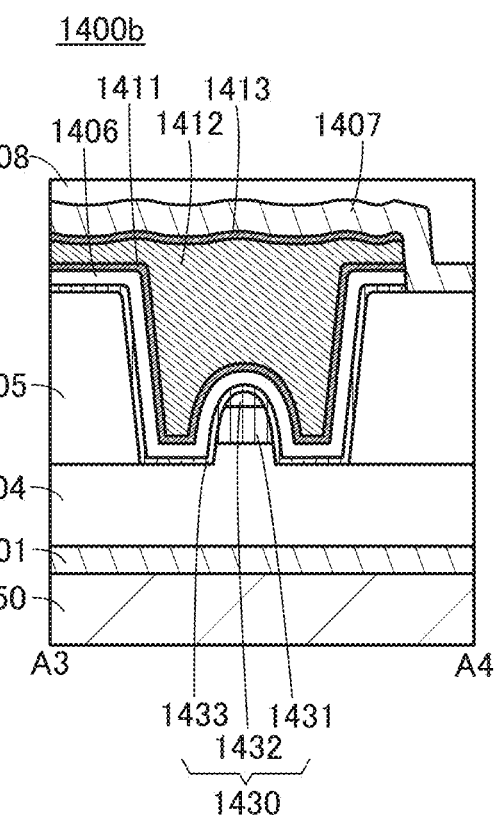

FIGS. 22A to 22C are a top view and cross-sectional diagrams of a transistor 1400b. FIG. 22A is a top view. FIG. 22B is a cross-sectional diagram taken along dashed-dotted line A1-A2 in FIG. 22A and FIG. 22C is a cross-sectional diagram taken along dashed-dotted line A3-A4 in FIG. 22A. Note that for simplification of the drawing, some components are not illustrated in the top view in FIG. 22A. Note that the dashed-dotted line A1-A2 and the dashed-dotted line A3-A4 are sometimes referred to as a channel length direction of the transistor 1400b and a channel width direction of the transistor 1400b, respectively.

In the transistor 1400a shown in FIGS. 19A to 19C, parts of the conductive films 1421 and 1423 that overlap with the gate electrode (the conductive films 1411 to 1413) can be reduced in thickness. An example of such a structure is shown in FIGS. 23A to 23C.

Figure 23A:
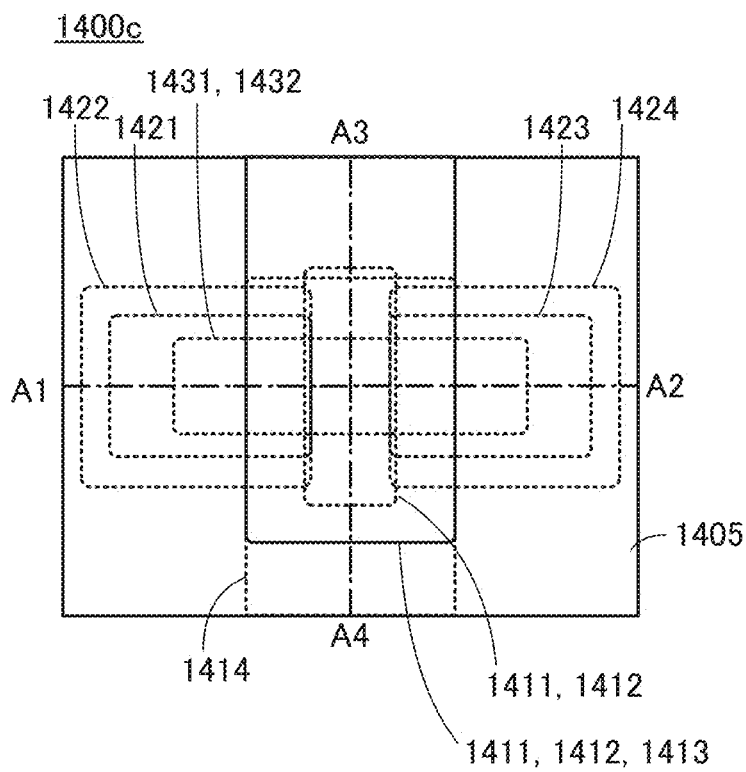
FIG. 23A illustrates an example of a top view, and FIGS. 23B and 23C each illustrate an example of a cross-sectional diagram.
Figure 23B:
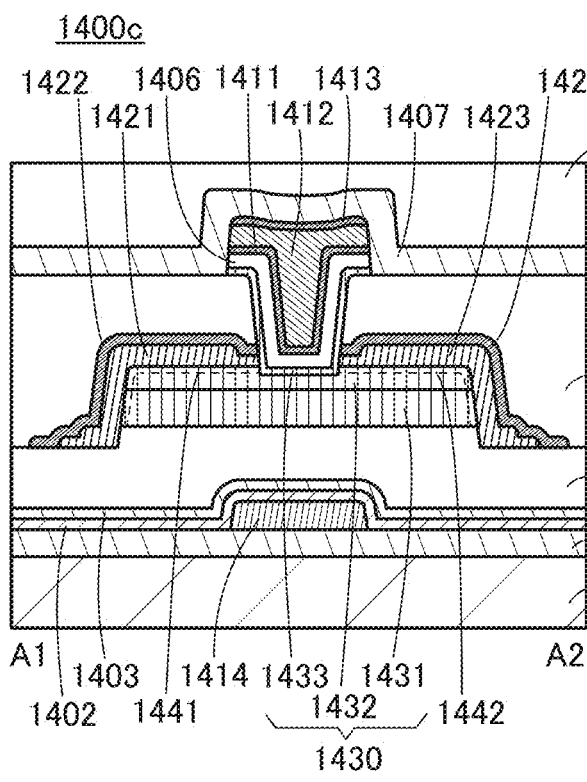
Figure 23C:
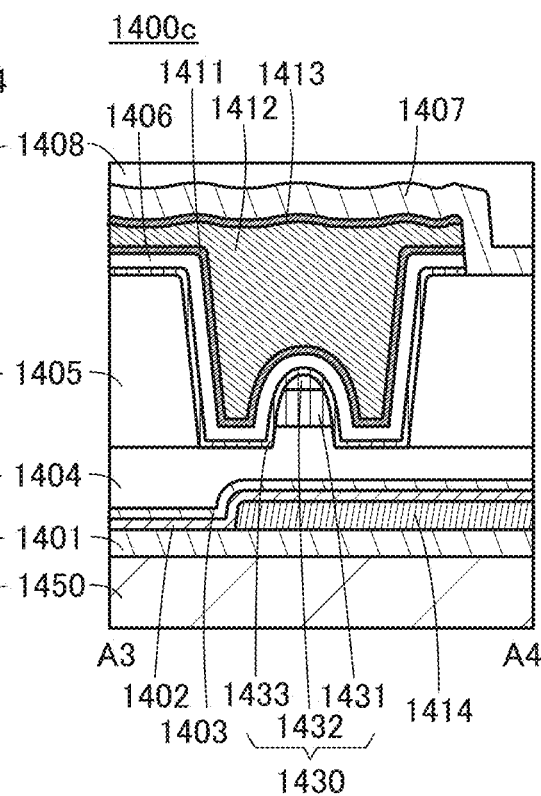

FIGS. 23A to 23C are a top view and cross-sectional diagrams of a transistor 1400c. FIG. 23A is a top view. FIG. 23B is a cross-sectional diagram taken along dashed-dotted line A1-A2 in FIG. 23A and FIG. 23C is a cross-sectional diagram taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c shown in FIG. 23B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure shown in FIG. 23B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 3 of Transistor>

In the transistor 1400c shown in FIGS. 23A to 23C, the width of the metal oxides 1431 and 1432 can be increased in the A3-A4 direction. An example of such a structure is illustrated in FIGS. 24A to 24C.

Figure 24A:
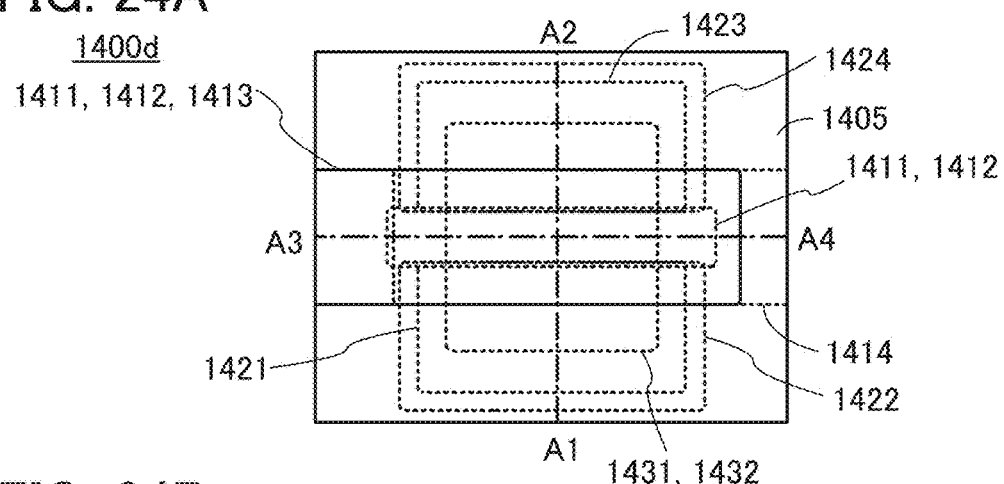
FIG. 24A illustrates an example of a top view, and FIGS. 24B and 24C each illustrate an example of a cross-sectional diagram.
Figure 24B:
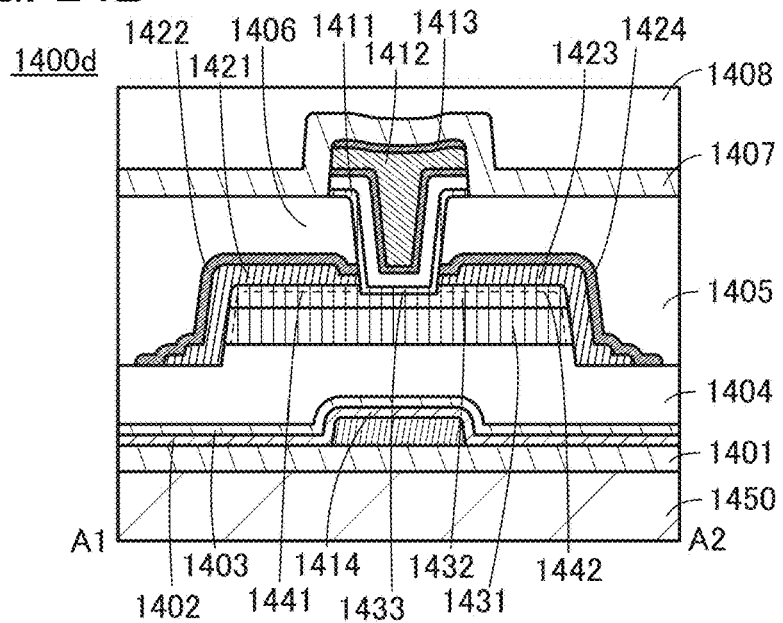
Figure 24C:
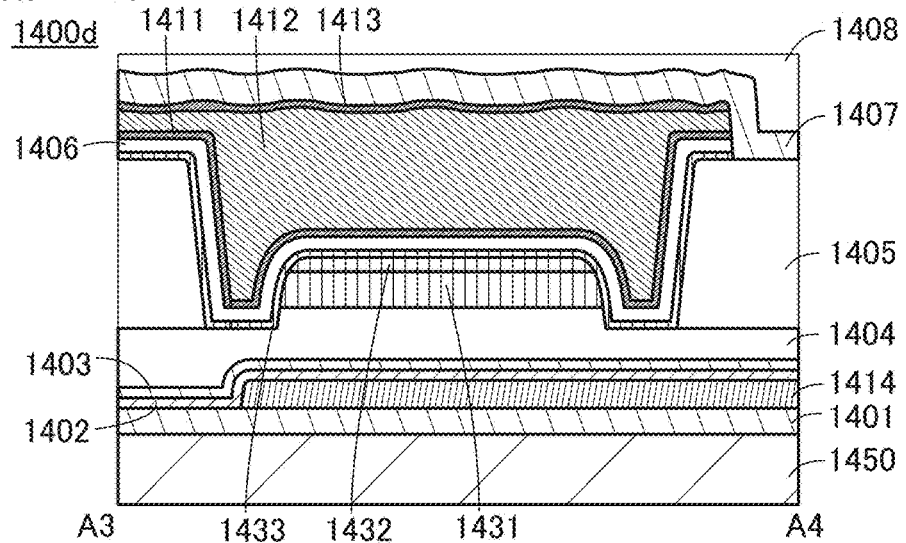

FIGS. 24A to 24C are a top view and cross-sectional diagrams of a transistor 1400d. FIG. 24A is the top view. FIG. 24B is a cross-sectional diagram taken along dashed-dotted line A1-A2 in FIG. 24A, and FIG. 24C is a cross-sectional diagram taken along dashed-dotted line A3-A4 in FIG. 24A. Note that for simplification of the drawing, some components in the top view in FIG. 24A are not illustrated. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure shown in FIGS. 24A to 24C, can have an increased on-state current.

<Structure Example 4 of Transistor>

In the transistor 1400c shown in FIGS. 23A to 23C, a plurality of regions (fins) consisting of the metal oxides 1431 and 1432 may be provided in the A3-A4 direction. An example of such a structure is illustrated in FIGS. 25A to 25C.

Figure 25A:
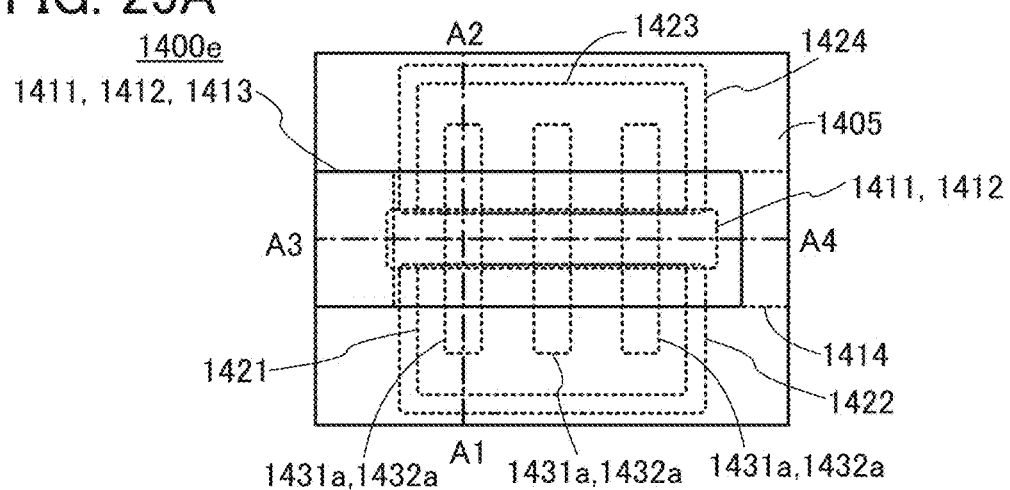
FIG. 25A illustrates an example of a top view, and FIGS. 25B and 25C each illustrate an example of a cross-sectional diagram.
Figure 25B:
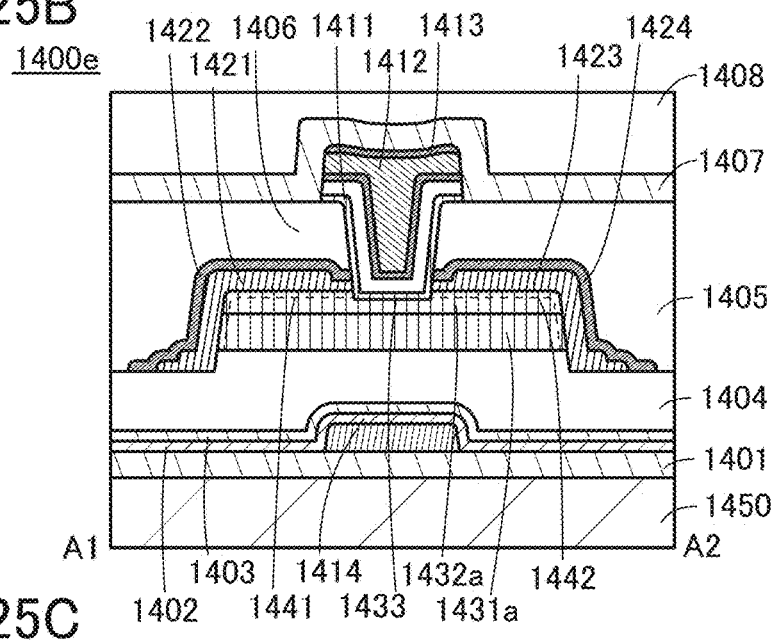
Figure 25C:
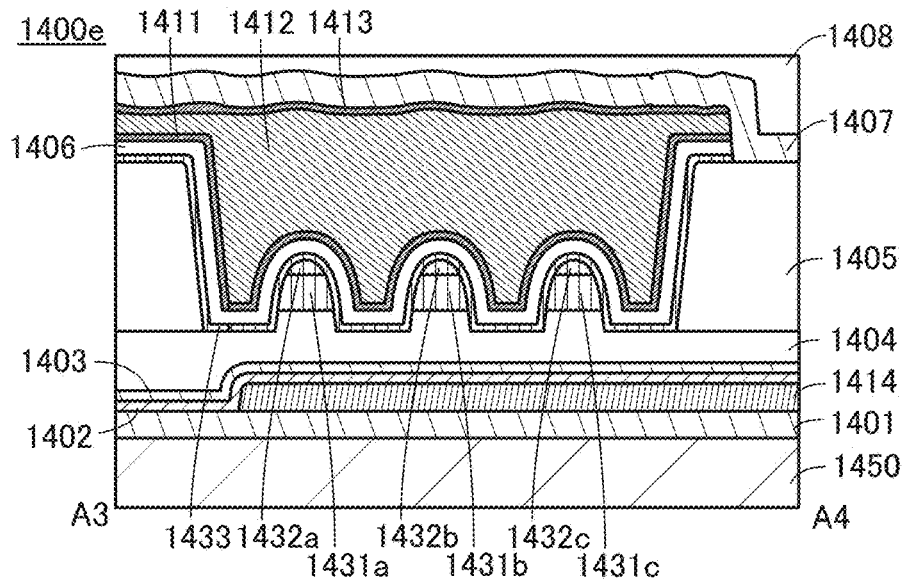

FIGS. 25A to 25C are a top view and cross-sectional diagrams of a transistor 1400e. FIG. 25A is the top view. FIG. 25B is a cross-sectional diagram taken along dashed-dotted line A1-A2 in FIG. 25A, and FIG. 25C is a cross-sectional diagram taken along dashed-dotted line A3-A4 in FIG. 25A. Note that for simplification of the drawing, some components in the top view in FIG. 25A are not illustrated. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, the gate electric field can be applied to the entire channel, so that a transistor with a high on-state current can be obtained.

<Structure Example 5 of Transistor>

Figure 26A:
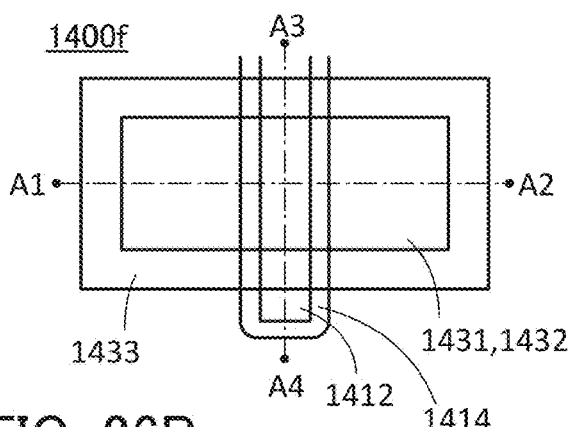
FIG. 26A illustrates an example of a top view, and FIGS. 26B, 26C and 26D each illustrate an example of a cross-sectional diagram.
Figure 26B:
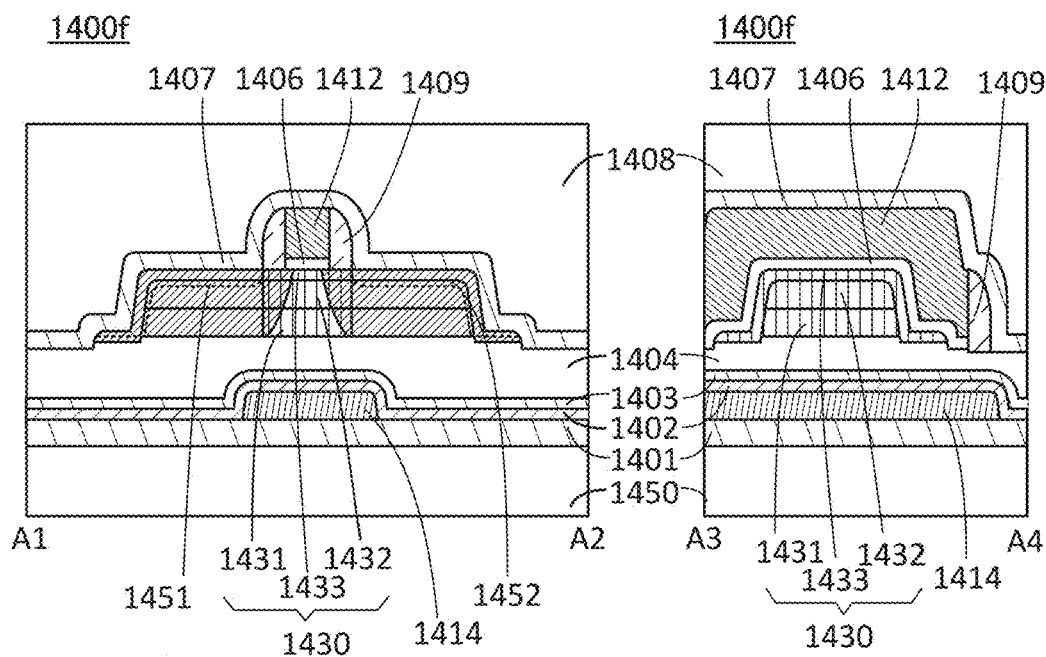
Figure 26C:
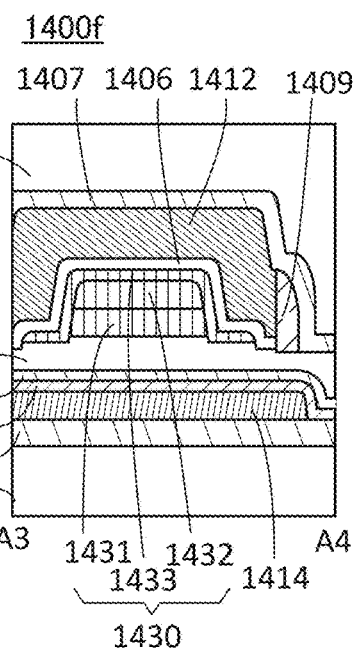

FIGS. 26A to 26D are a top view and cross-sectional diagrams of a transistor 1400f. FIG. 26A is a top view of the transistor 1400f. FIG. 26B is a cross-sectional diagram taken along dashed-dotted line A1-A2 in FIG. 26A and FIG. 26C is a cross-sectional diagram taken along dashed-dotted line A3-A4 in FIG. 26A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, the conductive film 1412 serves as a gate electrode of the transistor 1400f, and the insulating film 1409 serves as a sidewall insulating film of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

Figure 26D:
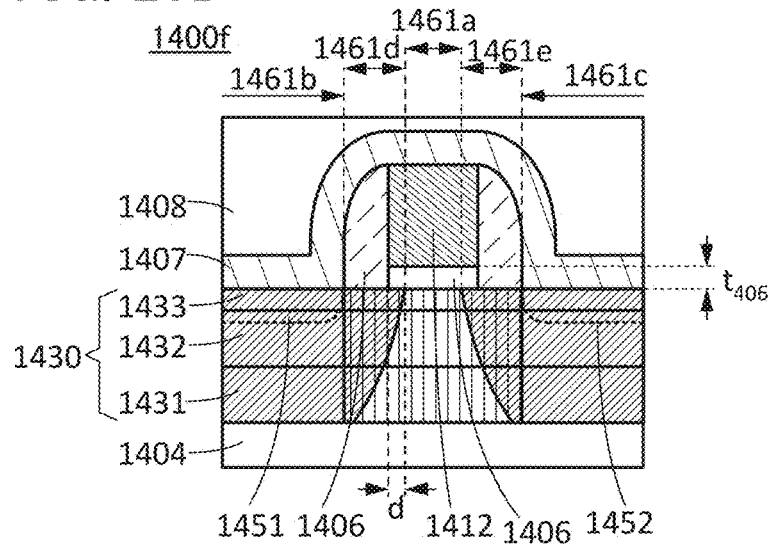

FIG. 26D is an enlarged view of part of FIG. 26B. As shown in FIG. 26D, regions 1461a to 1461e are formed in the metal oxide 1430. The regions 1461b to 1461e have a higher dopant concentration and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 26D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 26D, the border between the regions 1461b and 1461d overlaps with the border between the side edges of the insulating films 1407 and 1409. The same applies to the border between the regions 1461c and 1461e. Here, part of the regions 1461d and 1461e preferably overlaps with part of a region (a channel formation region) where the metal oxide 1432 and the conductive film 1412 overlap with each other. For example, the side edges of the regions 1461d and 1461e in the channel length direction are preferably positioned inward from the side edge of the conductive film 1412 by a distance d. In that case, the thickness $t_{406}$ of the insulating film 1406 and the distance d preferably satisfy $0.25t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from spreading inward too much in the channel formation region and thus the transistor 1400f can be prevented from being constantly in an on state.

The regions 1461b to 1461e are formed by ion doping treatment such as an ion implantation method. Therefore, as shown in FIG. 26D, the positions of the side edges of the regions 1461d and 1461e in the channel length direction are sometimes shifted closer to the side edge of the metal oxide 1430 in a channel length direction, in areas where the regions 1461d and 1461e are farther from the top surface of the metal oxide 1433. The distance d in this case is the distance between the side edge of the conductive film 1412 in the channel length direction and each of the side edges of the regions 1461d and 1461e that are closest to the inner part of the conductive film 1412.

In this case, for example, the regions 1461d and 1461e in the metal oxide 1431 do not not overlap with the conductive film 1412 in some cases. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b and 1461c to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 need not be formed in the case where the regions 1461b and 1461c have a sufficiently low resistance.

<Structure Example 6 of Transistor>

Figure 27A:
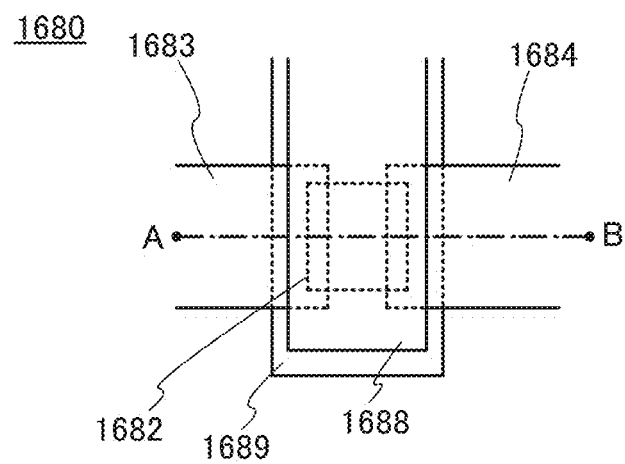
FIG. 27A illustrates an example of a top view.
Figure 27B:
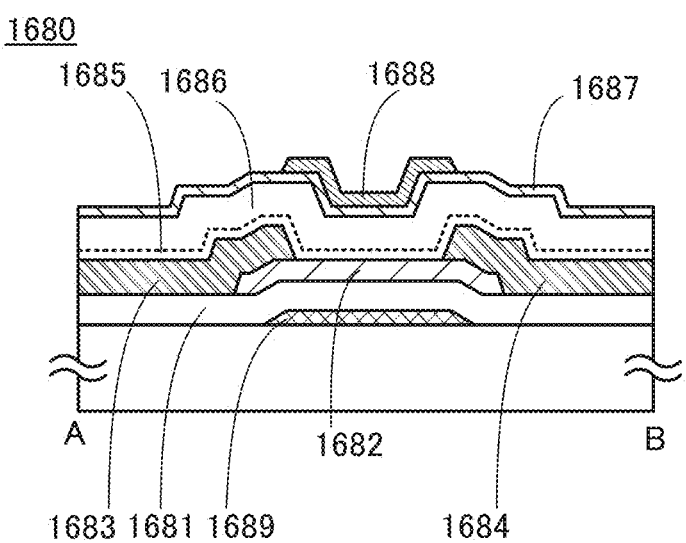
FIG. 27B illustrates an example of a cross-sectional diagram.

FIGS. 27A and 27B are a top view and a cross-sectional diagrams of a transistor 1680. FIG. 27A is a top view, and FIG. 27B is a cross-sectional diagram taken along dashed-dotted line A-B in FIG. 27A. Note that for simplification of the drawing, some components are increased or reduced in size, or omitted in FIGS. 27A and 27B. The direction of the dashed-dotted line A-B may be referred to as a channel length direction.

The transistor 1680 shown in FIG. 27B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 19A to 19C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of the threshold voltage. Note that the conductive film 1688 may be omitted in some cases.

The description of the metal oxide 1432 in FIGS. 19A to 19C can be referred to for the details of the semiconductor 1682. The semiconductor 1682 may be a single layer or a stack including a plurality of semiconductor layers.

The description of the conductive films 1421 to 1424 in FIGS. 19A to 19C can be referred to for the details of the conductive films 1683 and 1684.

The description of the insulating film 1406 in FIGS. 19A to 19C can be referred to for the details of the insulating film 1681.

The insulating films 1685 to 1687 are sequentially stacked over the semiconductor 1682 and the conductive films 1683 and 1684 in FIG. 27B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and preferably has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as shown in FIG. 27B. The insulating film 1685 preferably allows oxygen to pass therethrough, and preferably causes little damage to the semiconductor 1682 when the insulating film 1685 is formed compared with the case of the insulating film 1686. If the insulating film 1686 can be formed directly on the semiconductor 1682 while keeping the damage to the semiconductor 1682 small, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

An insulating film that has a higher density or that has fewer dangling bonds and is more chemically stable exhibits superior blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor).Thus, the use of the insulating film 1687 having the blocking effect can prevent a shift in the threshold voltage of the transistor 1680 due to the generation of donors.

In addition, in the case where an oxide semiconductor is used as the semiconductor 1682, the effect of insulating film 1687 to block the diffusion of oxygen prevents oxygen from the oxide semiconductor to diffuse to the outside. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 5

Described in this embodiment are structures of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned and a-b-plane anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 28A:
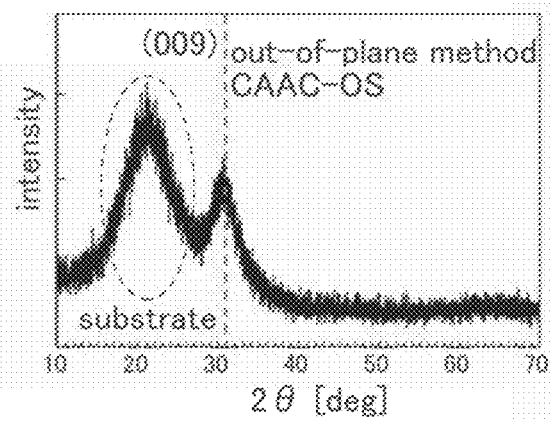
FIGS. 28A to 28E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 28B:
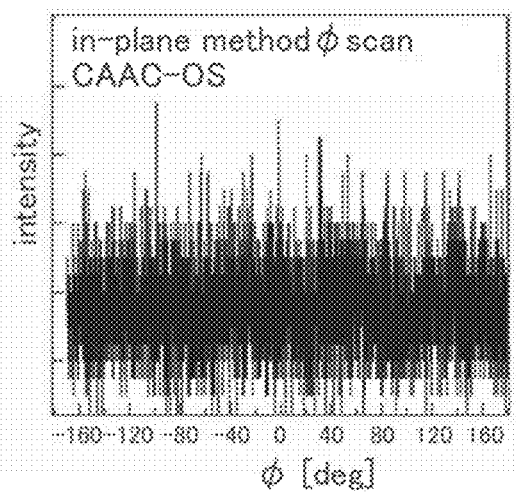
Figure 28C:
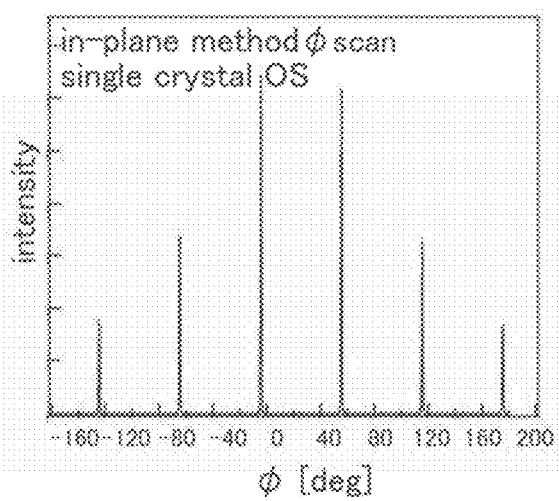

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 28B, a peak is not clearly observed. In contrast, in the case where single crystal InGaZnO$_4$ is subjected to φ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Figure 28D:
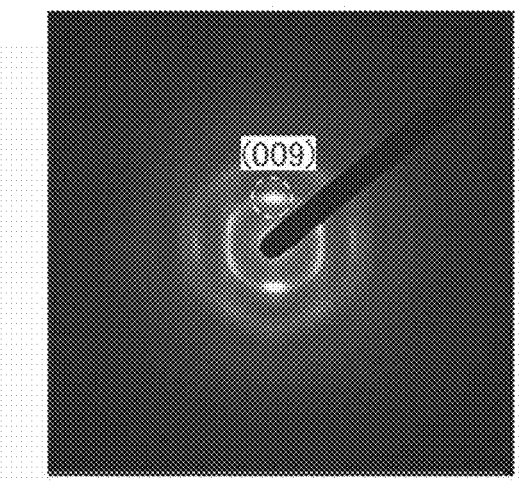
Figure 28E:
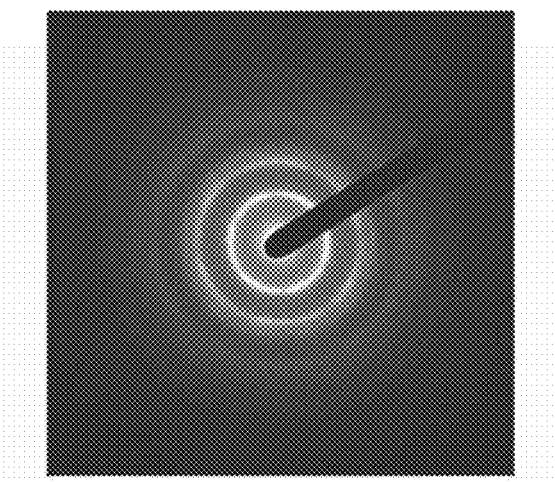

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 29A:
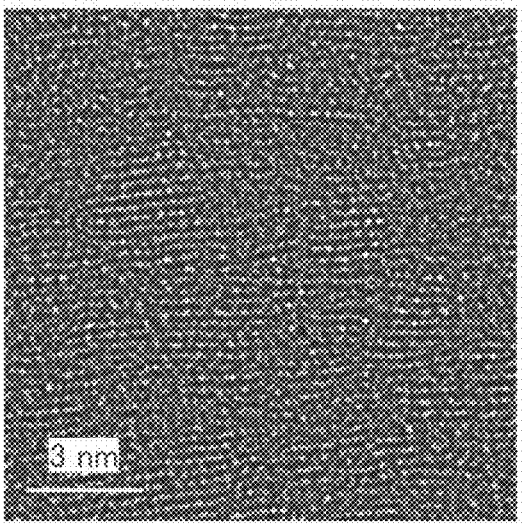
FIGS. 29A to 29E show a cross-sectional TEM image and plan-view TEM images of a CAAC-OS and images obtained through analysis thereof.

FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 47A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS film, and is parallel to the formation surface or the top surface of the CAAC-OS.

Figure 29B:
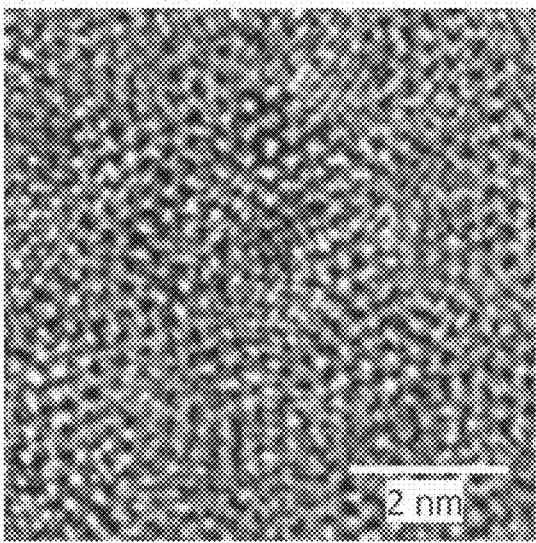
Figure 29C:
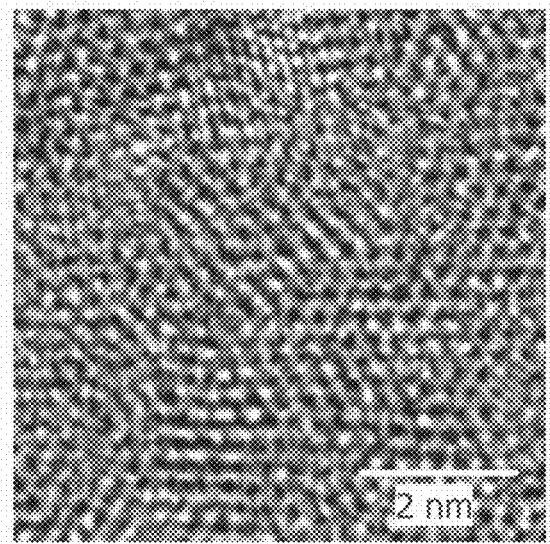
Figure 29D:
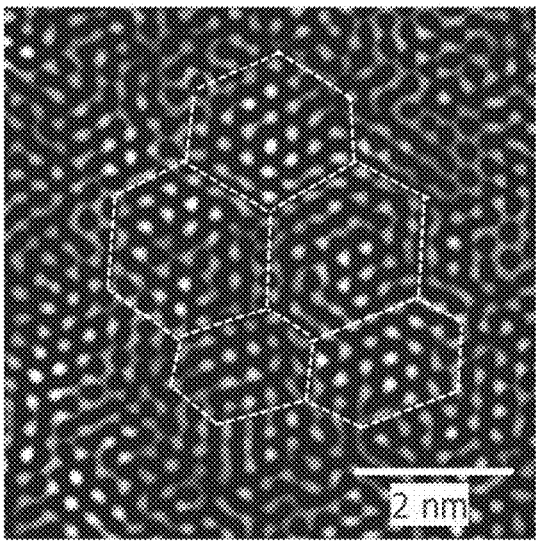
Figure 29E:
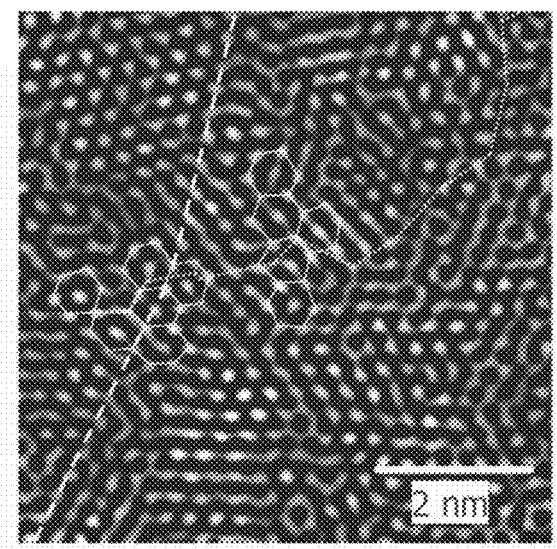

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the change of interatomic bond distance caused by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. For example, when the structure of an nc-OS is analyzed by an out-of-plane method, a peak indicating orientation does not appear. That is, a crystal of an nc-OS does not have orientation.

Figure 30A:
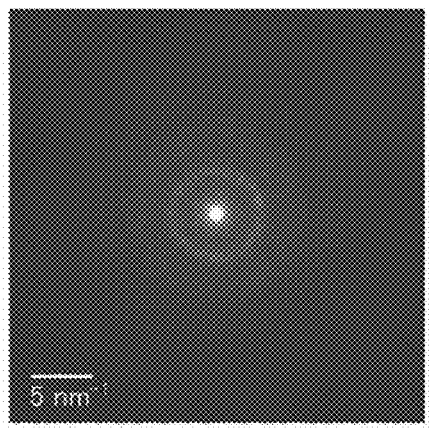
FIGS. 30A to 30D show electron diffraction patterns and a cross-sectional TEM image of an nc-OS.
Figure 30B:
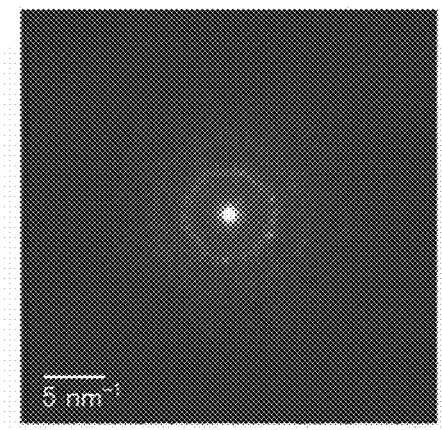

In addition, for example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 30A is observed. FIG. 30B shows a diffraction pattern obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
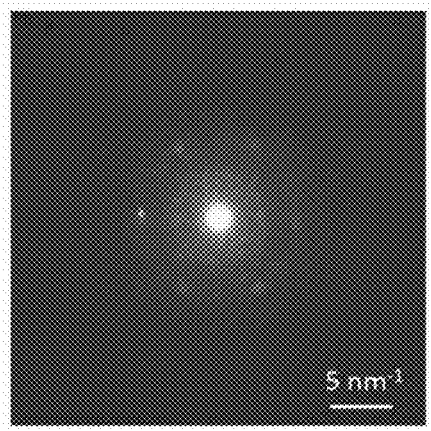

Furthermore, an electron diffraction pattern in which spots are arranged in an approximately regular hexagonal shape is observed in some cases as shown in FIG. 30C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 30D:
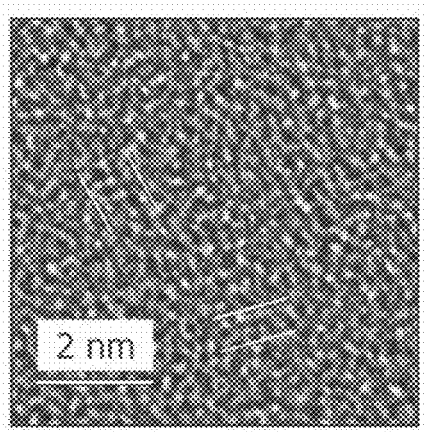

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 30D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 31A:
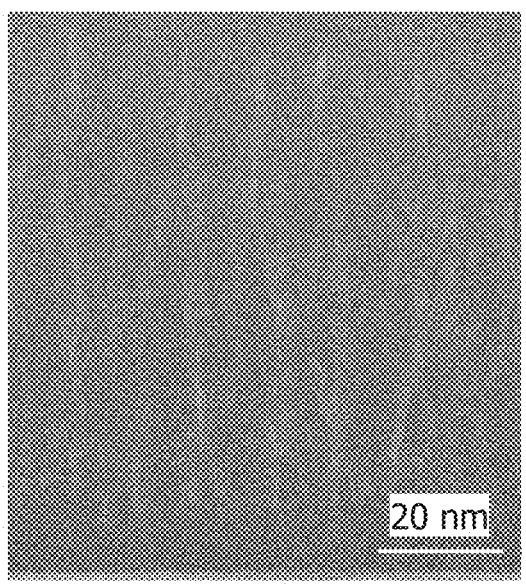
FIGS. 31A and 31B show cross-sectional TEM images of an a-like OS.
Figure 31B:
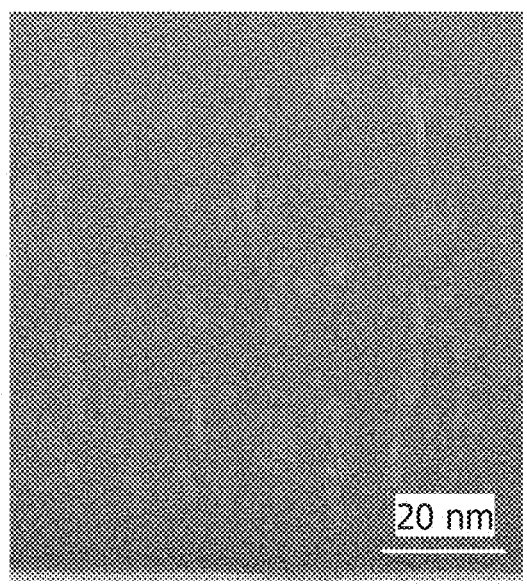

FIGS. 31A and 31B are high-resolution cross-sectional TEM images of an a-like OS. FIG. 31A is the high-resolution cross-sectional TEM image of the a-like OS at the start of the electron irradiation. FIG. 31B is the high-resolution cross-sectional TEM image of a-like OS after the electron ($e^-$) irradiation at $4.3 \times 10^8$ $e^-/nm^2$. FIGS. 31A and 31B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In-O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 32:
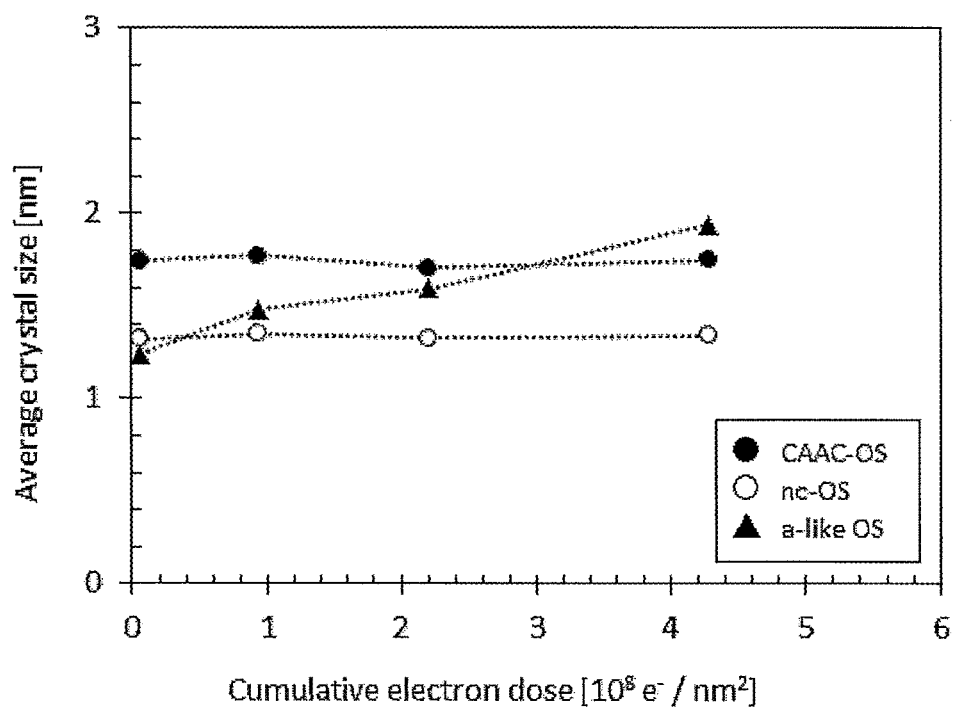
FIG. 32 shows a change of crystal parts of an In—Ga—Zn oxide owing to electron irradiation.

FIG. 32 shows change in the average size of crystal parts (at 22 points to 30 points) in each sample. Note that the crystal part size corresponds to the length of the lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 32, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e/(nm^2 \cdot s)$; and the diameter of the irradiation region was 230 nm.

In this manner, growth of the crystal part in the a-like OS is induced by electron irradiation in some cases. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In: Ga: Zn=1:1:1, the density of single crystal $InGaZnO_4$ with a rhombohedral crystal structure is 6.357 g/cm$^3$. Accordingly, in the case of the oxide semiconductor having an atomic ratio of In: Ga: Zn=1:1:1, the density of the a-like OS is higher than or equal to 5.0 g/cm$^3$ and lower than 5.9 g/cm$^3$. For example, in the case of the oxide semiconductor having an atomic ratio of In: Ga: Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) described in one embodiment with another part of the diagram, a different diagram (or may be part of the diagram) described in the embodiment, and/or a diagram (or may be part of the diagram) described in one or a plurality of different embodiments, much more diagrams can be formed.

<Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be used interchangeably depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms that are not mentioned in the above embodiments.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from design parameters, the shape of the semiconductor need to be known beforehand. Therefore, when accurate shape information of the semiconductor is not available, accurate measurement of an effective channel width is difficult.

Thus, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases. <<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

REFERENCE NUMERALS

A1-A2: dashed-dotted line, A3-A4: dashed-dotted line, C0: capacitor, C1: capacitor, MUL1: multiplier circuit, MUL2: multiplier circuit, MUL3: multiplier circuit, MUL4: multiplier circuit, Tr01: transistor, Tr08: transistor, Tr11: transistor, Tr14: transistor, Tr15: transistor, Tr16: transistor, Tr17: transistor, 10: image data, 11: triangle, 12: circle, 20: image data, 30: image data, 31: region, 40: image data, 41: region, 100: module, 101: amplifier, 102: selector circuit, 103: differential amplifier, 104: switch, 105: resistor, 106: unity gain buffer, 107: amplifier circuit, 108: buffer, 111: differential amplifier, 112: switch, 113: resistor, 114: selector circuit, 115: differential amplifier, 116: switch, 117: resistor, 121: operational amplifier, 122: operational amplifier, 500: broadcasting system, 510: camera, 511: transceiver, 512: receiver, 513: display device, 520: image sensor, 521: image processor, 522: encoder, 523: modulator, 525: demodulator, 526: decoder, 527: image processor, 528: display portion, 540: Raw data, 541: video data, 542: encoding data, 543: broadcasting signal, 544: video data, 545: data signal, 551: data stream, 552: data stream, 553: data stream, 560: TV, 561: broadcasting station, 562: artificial satellite, 563: radio tower, 564: antenna, 565: antenna, 566A: radio wave, 566B: radio wave, 567A: radio wave, 567B: radio wave, 571: receiver, 572: wireless transmitter, 573: wireless transmitter, 574: receiver, 575: connector portion, 591: circuit, 591a: inter-frame prediction circuit, 591b: motion-compensated prediction circuit, 591c: DCT circuit, 592: circuit, 593: circuit, 593a: LDPC encoding circuit, 593b: authentication processing circuit, 593c: scrambler, 594: circuit, 600: ambulance, 601: medical institution, 602: medical institution, 605: high-speed network, 610: camera, 611: encoder, 612: communication device, 615: video data, 616: video data, 620: communication device, 621: decoder, 623: display device, 1400*a:* transistor, 1400*b:* transistor, 1400*c:* transistor, 1400*d:* transistor, 1400*e:* transistor, 1400*f:* transistor, 1401: insulating film, 1402: insulating film, 1403: insulating film, 1404: insulating film, 1405: insulating film, 1406: insulating film, 1407: insulating film, 1408: insulating film, 1409: insulating film, 1411: conductive film, 1412: conductive film, 1413: conductive film, 1414: conductive film, 1421: conductive film, 1422: conductive film, 1423: conductive film, 1424: conductive film, 1430: metal oxide, 1431: metal oxide, 1431*a:* metal oxide, 1431*b:* metal oxide, 1431*c:*metal oxide, 1432: metal oxide, 1432*a:* metal oxide, 1432*b:* metal oxide, 1432*c:* metal oxide, 1433: metal oxide, 1441: region, 1442: region, 1450: substrate, 1451: low-resistance region, 1452: low-resistance region, 1461: region, 1461*a:* region, 1461*b:* region, 1461*c:* region, 1461*d:* region, 1461*e:* region, 1462: region, 1463: region, 1680: transistor, 1681: insulating film, 1682: semiconductor, 1683: conductive film, 1684: conductive film, 1685: insulating film, 1686: insulating film, 1687: insulating film, 1688: conductive film, and 1689: conductive film.

This application is based on Japanese Patent Application serial no. 2015-208505 filed with Japan Patent Office on Oct. 23, 2015 and Japanese Patent Application serial no. 2015-228425 filed with Japan Patent Office on Nov. 24, 2015, the entire contents of which are hereby incorporated by reference.

The invention claimed is:

1. A module comprising:
a first circuit;
a second circuit; and
a third circuit;
wherein the first circuit comprises a first function of amplifying a first signal and outputting the amplified first signal to the second circuit, and a second function of converting the first signal from current to voltage, amplifying the converted first signal and outputting the amplified first signal to another module;
wherein the second circuit comprises a first multiplier circuit configured to change data corresponding to a connection strength between the first circuit, an analog memory configured to store the changed data, and a second multiplier circuit configured to output a second signal corresponding to the amplified first signal that has been weighted in accordance with the changed data;
wherein the third circuit is configured to convert the second signal from current to voltage and output the converted second signal to an outside; and
wherein the analog memory comprises a transistor comprising an oxide semiconductor in a channel formation region.

2. The module according to claim 1,
wherein the first circuit is a neuron circuit.

3. The module according to claim 1,
wherein the second circuit is a synapse circuit.

4. The module according to claim 1, wherein the third circuit is an error circuit.

5. An electronic device comprising the module according to claim 1, further comprising:
an encoder configured to encode video data;
wherein the video data comprises first video data and second video data; and
wherein the module compares the first video data and the second video data when the first video data and the second video data are input to the module, and obtains a motion vector from the first video data to the second video data when the first video data and the second video data match.

6. A module comprising:
a neuron circuit;
a synapse circuit; and
an error circuit;
wherein the synapse circuit comprises a first multiplier circuit configured to change data corresponding to a connection strength between the neuron circuits, an analog memory configured to store the changed data, and a second multiplier circuit configured to output a second signal corresponding to the amplified first signal that has been weighted in accordance with the changed data, and
wherein the analog memory comprises a transistor comprising an oxide semiconductor in a channel formation region.

7. The module according to claim 6,
wherein the neuron circuit comprises a first selector circuit configured to select whether the neuron circuit functions as an input neuron circuit or as a hidden neuron circuit, and
wherein the neuron circuit is configured to amplify an input signal and output the amplified input signal to the synapse circuit when the neuron circuit functions as the input neuron circuit, and
wherein the neuron circuit is configured to convert the input signal from current to voltage and amplify the converted input signal and output the amplified input signal to another synapse circuit when the neuron circuit functions as the hidden neuron circuit.

8. The module according to claim 6,
wherein the error circuit comprises a second selector circuit configured to select whether the error circuit functions as an output neuron circuit or as a hidden error circuit,
wherein the error circuit is configured to convert the current output from the synapse circuit to voltage and output the converted voltage to another module when the error circuit functions as the output neuron circuit, and
wherein the error circuit is configured to multiply a derivative of the converted voltage and a difference signal between an instructor signal and a reference signal when the error circuit functions as the hidden error circuit.

* * * * *